(12) United States Patent
Lee et al.

(10) Patent No.: US 11,335,734 B2
(45) Date of Patent: May 17, 2022

(54) ORGANIC LIGHT EMITTING DIODE DISPLAY DEVICE

(71) Applicant: Samsung Display Co., Ltd., Yongin-Si (KR)

(72) Inventors: Dae-Won Lee, Seoul (KR); Tae Kon Kim, Asan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/401,392

(22) Filed: May 2, 2019

(65) Prior Publication Data

US 2019/0341431 A1  Nov. 7, 2019

(30) Foreign Application Priority Data

May 2, 2018 (KR) .................. 10-2018-0050907

(51) Int. Cl.
| | |
|---|---|
| *H01L 27/32* | (2006.01) |
| *H01L 51/50* | (2006.01) |
| *G09G 3/3266* | (2016.01) |
| *G09G 3/3291* | (2016.01) |
| *G09G 3/3258* | (2016.01) |

(52) U.S. Cl.
CPC ........ *H01L 27/3211* (2013.01); *G09G 3/3258* (2013.01); *G09G 3/3266* (2013.01); *G09G 3/3291* (2013.01); *H01L 27/3276* (2013.01); *H01L 51/5036* (2013.01); *G09G 2300/0426* (2013.01); *G09G 2300/0452* (2013.01)

(58) Field of Classification Search
CPC combination set(s) only.
See application file for complete search history.

(56) References Cited

U.S. PATENT DOCUMENTS

| | | | |
|---|---|---|---|
| 10,068,520 B2* | 9/2018 | Xiang | ................ G09G 3/3208 |
| 2013/0187131 A1* | 7/2013 | Chung | ................ H01L 51/5218 |
| | | | 257/40 |
| 2015/0161943 A1* | 6/2015 | Shim | ................ G09G 3/3225 |
| | | | 345/76 |
| 2017/0033171 A1* | 2/2017 | Kim | .................. H01L 27/3272 |
| 2017/0194391 A1* | 7/2017 | Xiong | ............... H01L 27/3258 |

(Continued)

FOREIGN PATENT DOCUMENTS

| | | |
|---|---|---|
| JP | 4156476 B2 | 9/2008 |
| KR | 10-0496421 B1 | 6/2005 |

(Continued)

*Primary Examiner* — Telly D Green
(74) *Attorney, Agent, or Firm* — Innovation Counsel LLP

(57) ABSTRACT

An organic light emitting diode display device includes a substrate, first and second active patterns, and first and second sub-pixel structures. The substrate has a first sub-pixel circuit region including a first driving transistor region and a second sub-pixel circuit region including a second driving transistor region. The first active pattern is disposed in the first sub-pixel circuit region and has a first bent portion in the first driving transistor region. The second active pattern is disposed in the second sub-pixel circuit region and has a second bent portion in the second driving transistor region. In a direction in a plan surface, the first active pattern has a first recess formed by the first bent portion, and the second active pattern has a second recess formed by the second bent portion. An area of the second recess is less than that of the first recess.

22 Claims, 15 Drawing Sheets

(56) References Cited

U.S. PATENT DOCUMENTS

| | | | | |
|---|---|---|---|---|
| 2017/0249896 A1* | 8/2017 | Kim | ...................... | H01L 27/124 |
| 2017/0287396 A1* | 10/2017 | Akimoto | .............. | G09G 3/3233 |
| 2017/0301286 A1* | 10/2017 | Xiang | .................. | G09G 3/3233 |
| 2018/0047799 A1* | 2/2018 | Lim | .................... | H01L 27/3276 |
| 2018/0183008 A1* | 6/2018 | Song | ..................... | H01L 27/326 |
| 2018/0226459 A1* | 8/2018 | Bae | ....................... | H01L 27/124 |

FOREIGN PATENT DOCUMENTS

| | | | |
|---|---|---|---|
| KR | 10-0573108 B1 | 4/2006 |
| KR | 10-0960908 B1 | 6/2010 |
| KR | 10-1795691 B1 | 11/2017 |

* cited by examiner

FIG. 8
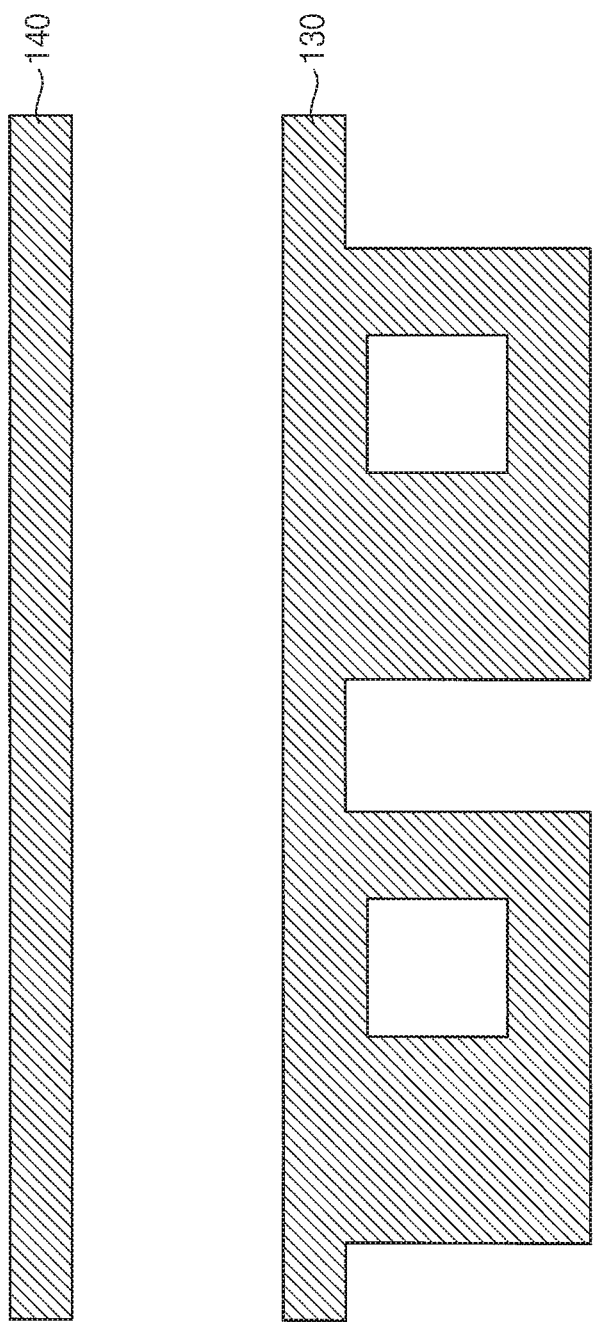
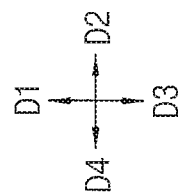

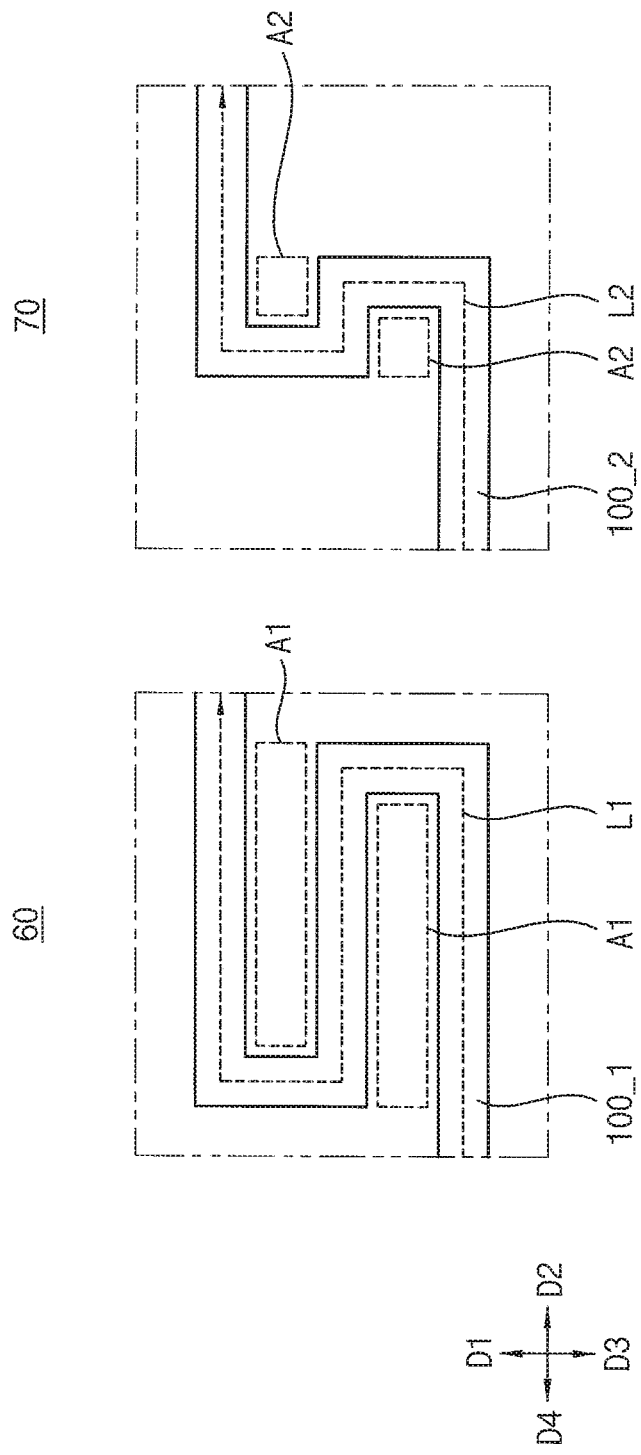

ORGANIC LIGHT EMITTING DIODE DISPLAY DEVICE

CROSS-REFERENCE TO RELATED APPLICATION(S)

This application claims priority under 35 USC § 119 to Korean Patent Applications No. 10-2018-0050907, filed on May 2, 2018 in the Korean Intellectual Property Office (KIPO), the disclosure of which is incorporated herein in its entirety by reference.

BACKGROUND

1. Field

Example embodiments of the present disclosure relate generally to an organic light emitting diode display device, more particularly, to an organic light emitting diode display device having sub-pixels.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting diode ("OLED") display device. Compared to the LCD device, the OLED display device has many advantages such as higher luminance and a wider viewing angle. In addition, the OLED display device can be made thinner because the OLED display device does not require a backlight unit. In the OLED display device, electrons and holes are injected into an organic thin layer through a cathode and an anode, and then recombined in the organic thin layer to generate excitons, thereby emitting a light of a certain wavelength.

The OLED display device may include a plurality of sub-pixels, for example, sub-pixels emitting a red color of light, a green color of light, and a blue color of light. When the OLED display device displays an image (e.g., a black color) at a low gradation, a defect caused by multiple time programming (hereinafter referred to as an "MTP defect") may occur due to an insufficient data output voltage of the blue sub-pixel because a voltage margin of a blue sub-pixel is relatively small. In addition, when a driving range of a driving transistor is increased to improve a mura effect while the OLED display device displays the image, the MTP defect may adversely occur.

SUMMARY

Some example embodiments of the present disclosure provide an organic light emitting diode ("OLED") display device including sub-pixels.

According to one aspect of example embodiments, an OLED display device includes a substrate, a first active pattern, a second active pattern, a first sub-pixel structure, and a second sub-pixel structure. The substrate has a first sub-pixel circuit region including a first driving transistor region and a second sub-pixel circuit region including a second driving transistor region. The first sub-pixel circuit region is located adjacent to the second sub-pixel circuit region. The first active pattern is disposed in the first sub-pixel circuit region on the substrate and has a first bent portion in the first driving transistor region. The first active pattern has a first recess formed by the first bent portion in a direction of a plan surface. The second active pattern is disposed in the second sub-pixel circuit region on the substrate and has a second bent portion in the second driving transistor region. The second active pattern has a second recess formed by the second bent portion in the direction in the plan surface. An area of the second recess is less than an area of the first recess. The first sub-pixel structure is disposed on the first active pattern, and the second sub-pixel structure is disposed on the second active pattern.

In example embodiments, the first bent portion may include a first extension extending in a first direction that is perpendicular to an upper surface of the substrate, a second extension extending from a first distal end of the first extension in a second direction that is perpendicular to the first direction, and a third extension extending from a first distal end of the second extension in a third direction that is perpendicular to the second direction and is opposite to the first direction. The first, second, and third extensions may be integrally formed.

In example embodiments, a space formed by the first, second, and third extensions may be defined as the first recess.

In example embodiments, the first active pattern may have a shape that is bent in the first direction in the first driving transistor region.

In example embodiments, the second bent portion may include a fourth extension extending in the first direction, a fifth extension extending from a first distal end of the fourth extension in the second direction, and a sixth extension extending from a first distal end of the fifth extension in the third direction. The fourth, fifth, and sixth extensions may be integrally formed.

In example embodiments, a space formed by the fourth, fifth, and sixth extensions may be defined as the second recess.

In example embodiments, the second active pattern may have a shape that is bent in the first direction in the second driving transistor region.

In example embodiments, the first bent portion may have a first width, and the second bent portion may have a second width that is less than the first width.

In example embodiments, the first sub-pixel circuit region may further include a first switching transistor region surrounding the first driving transistor region, and the second sub-pixel circuit region may further include a second switching transistor region surrounding the second driving transistor region.

In example embodiments, the first active pattern may further include a seventh extension and a first protrusion. The seventh extension may be disposed in the first switching transistor region, and may be spaced apart from the first bent portion in a fourth direction that is opposite to the second direction. The seventh extension may extend in the first direction. The first protrusion may be protruded from the seventh extension in the second direction, and may be coupled to a second distal end that is opposite to the first distal end of the first extension. The seventh extension, the first protrusion, and the first bent portion may be integrally formed.

In example embodiments, the second active pattern may further include an eighth extension and a second protrusion. The eighth extension may be disposed in the second switching transistor region, and may be spaced apart from the second bent portion in the fourth direction. The eighth extension may extend in the first direction. The second protrusion may be protruded from the eighth extension in the second direction, and may be coupled to a second distal end that is opposite to the first distal end of the fourth extension. The eighth extension, the second protrusion, and the second bent portion may be integrally formed.

In example embodiments, the OLED display device may further include a first gate wiring extending in the second direction on the seventh extension of the first active pattern and the eighth extension of the second active pattern.

In example embodiments, a first switching transistor may be disposed in a portion where the first gate wiring crosses the seventh extension, and a second switching transistor may be defined in a portion where the first gate wiring crosses the eighth extension.

In example embodiments, the OLED display device may further include a first gate electrode and a second gate electrode. The first gate electrode may be disposed on the first bent portion, and the first gate electrode and the first bent portion may form a first driving transistor. The second gate electrode may be disposed on the second bent portion, and the second gate electrode and the second bent portion may form a second driving transistor.

In example embodiments, the first and second active patterns may have a same shape.

In example embodiments, a first area where the first gate electrode overlaps the first bent portion may be greater than a second area where the second gate electrode overlaps the second bent portion.

In example embodiments, a distance of the first active pattern that overlaps the first gate electrode may be greater than a distance of the second active pattern that overlaps the second gate electrode.

In example embodiments, the first sub-pixel structure may include a first lower electrode and a first light emitting layer disposed on the first lower electrode, and the second sub-pixel structure may include a second lower electrode and a second light emitting layer disposed on the second lower electrode.

In example embodiments, the first light emitting layer may emit a red color of light or a green color of light, and the second light emitting layer may emit a blue color of light.

In example embodiments, the first driving transistor and the first active pattern may form a first sub-pixel circuit, and the second driving transistor and the second active pattern may form a second sub-pixel circuit.

As the second active pattern of the OLED display device according to example embodiments has a relatively small second area and/or a relatively short second distance in the second driving transistor region, an MTP defect of the OLED display device may be improved, thereby improving visibility of the OLED display device.

BRIEF DESCRIPTION OF THE DRAWINGS

Example embodiments of the present disclosure can be understood in more detail from the following description taken in conjunction with the accompanying drawings, in which:

FIGS. 7 through 11 are layout diagrams for describing the OLED display device of FIG. 1;

FIG. 15 is a layout diagram illustrating still another example of an active pattern included in an OLED display device in accordance with example embodiments.

DETAILED DESCRIPTION OF THE EMBODIMENTS

Hereinafter, embodiments of the present inventive concept will be explained in detail with reference to the accompanying drawings.

Figure 1:
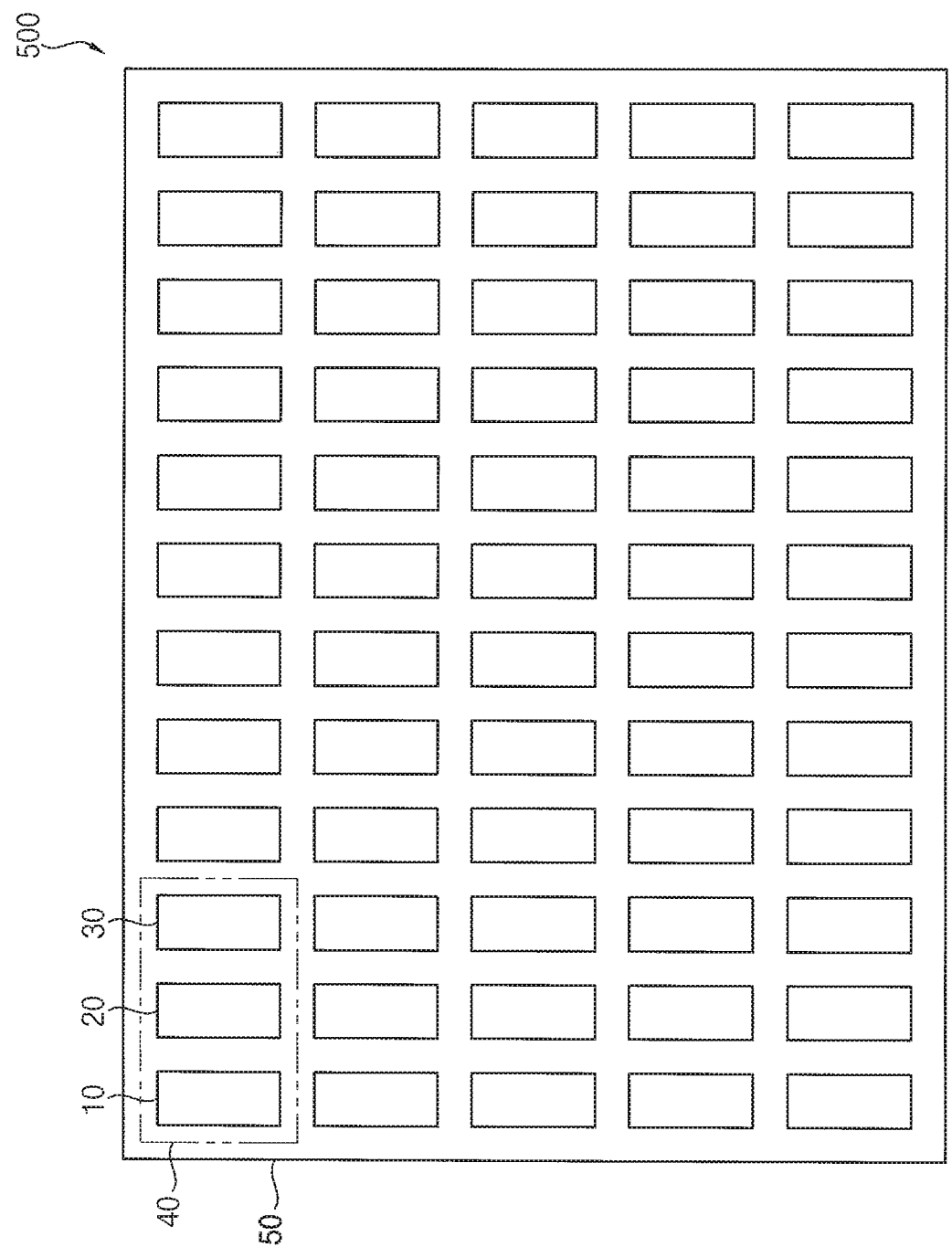
FIG. 1 is a plan view illustrating an organic light emitting diode ("OLED") display device in accordance with example embodiments.

FIG. 1 is a plan view illustrating an organic light emitting diode ("OLED") display device in accordance with example embodiments.

Referring to FIG. 1, an OLED display device 500 may include a substrate 50, and the substrate 50 may have a plurality of pixel circuit regions 40. The pixel circuit regions 40 may be arranged in a first direction D1 and a second direction D2 on the entire substrate 50. The first direction D1 may be perpendicular to an upper surface of the substrate 50, and the second direction D2 may be perpendicular to the first direction D1. In addition, each of the pixel circuit regions 40 may include first, second, and third sub-pixel circuit regions 10, 20, and 30, and one pixel circuit region 40 includes the first, second, and third sub-pixel circuit regions 10, 20 and 30.

Although the example embodiment shown in FIG. 1 illustrates one pixel circuit region 40 that includes three sub-pixel circuit regions, but the present disclosure is not limited thereto. For example, one pixel circuit region 40 may include two sub-pixel circuit regions or at least four sub-pixel circuit regions.

First, second, and third sub-pixel circuits may be disposed in the first, second, and third sub-pixel circuit regions 10, 20, and 30, respectively. For example, the first sub-pixel circuit disposed in the first sub-pixel circuit region 10 may be coupled to (or connected to) a first sub-pixel structure capable of emitting a red color of light, the second sub-pixel circuit disposed in the second sub-pixel circuit region 20 may be coupled to a second sub-pixel structure capable of emitting a green color of light, and the third sub-pixel circuit disposed in the third sub-pixel circuit region 30 may be coupled to a third sub-pixel structure capable of emitting a blue color of light. In addition, various wirings may be disposed in the first, second, and third sub-pixel circuit regions 10, 20, and 30 on the substrate 50. For example, the wirings may include data signal wirings, scan signal wirings, light emission signal wirings, data initialization signal wirings, and power supply voltage wirings. In other words, the OLED display device 500 may include a plurality of sub-pixel circuits, a plurality of sub-pixel structures, and a plurality of wirings.

In example embodiments, the first sub-pixel structure may be disposed to overlap the first sub-pixel circuit region 10, the second sub-pixel structure may be disposed to overlap the second sub-pixel circuit region 20, and the third sub-pixel structure may be disposed to overlap the third sub-pixel circuit region 30. Alternatively, the first sub-pixel structure may be disposed to overlap a portion of the first sub-pixel circuit region 10 and a portion of another sub-pixel circuit region that is different from the first sub-pixel circuit region 10, the second sub-pixel structure may be disposed to overlap a portion of the second sub-pixel circuit region 20 and a portion of another sub-pixel circuit region that is different from the second sub-pixel circuit region 20, and the third sub-pixel structure may be disposed to overlap a portion of the third sub-pixel circuit region 30 and a portion of another sub-pixel circuit region that is different from the third sub-pixel circuit region 30.

For example, the first, second, and third sub-pixel structures may be arranged using a red, green and blue (RGB) stripe pattern where sub-pixels of tetragons having the same size are sequentially arranged, a s-stripe pattern that includes a blue sub-pixel structure having a relatively large area, a white, red, green and blue (WRGB) pattern that includes a white sub-pixel structure in addition to the red, green, and blue sub-pixel structures, and a pen-tile pattern that is repeatedly arranged in an red-green (RG)-green-blue (GB) pattern.

In addition, at least one driving transistor, at least one switching transistor, and at least one capacitor may be disposed in each of the first, second, and third sub-pixel circuit regions 10, 20, and 30. In example embodiments, one driving transistor, eight switching transistors, and one capacitor may be disposed in each of the first, second, and third sub-pixel circuit regions 10, 20, and 30.

In example embodiments, each of the first, second, and third sub-pixel circuit regions 10, 20, and 30 and the pixel circuit regions 40 has a plan shape of a tetragon, but the present disclosure is not limited thereto. For example, each of the first, second, and third sub-pixel circuit regions 10, 20, and 30 and the pixel circuit regions 40 may have a plan shape of a substantially triangle, a plan shape of a substantially diamond, a plan shape of a substantially polygon, a plan shape of a substantially circle, a plan shape of a substantially athletic track, or a plan shape of a substantially oval.

Figure 2:
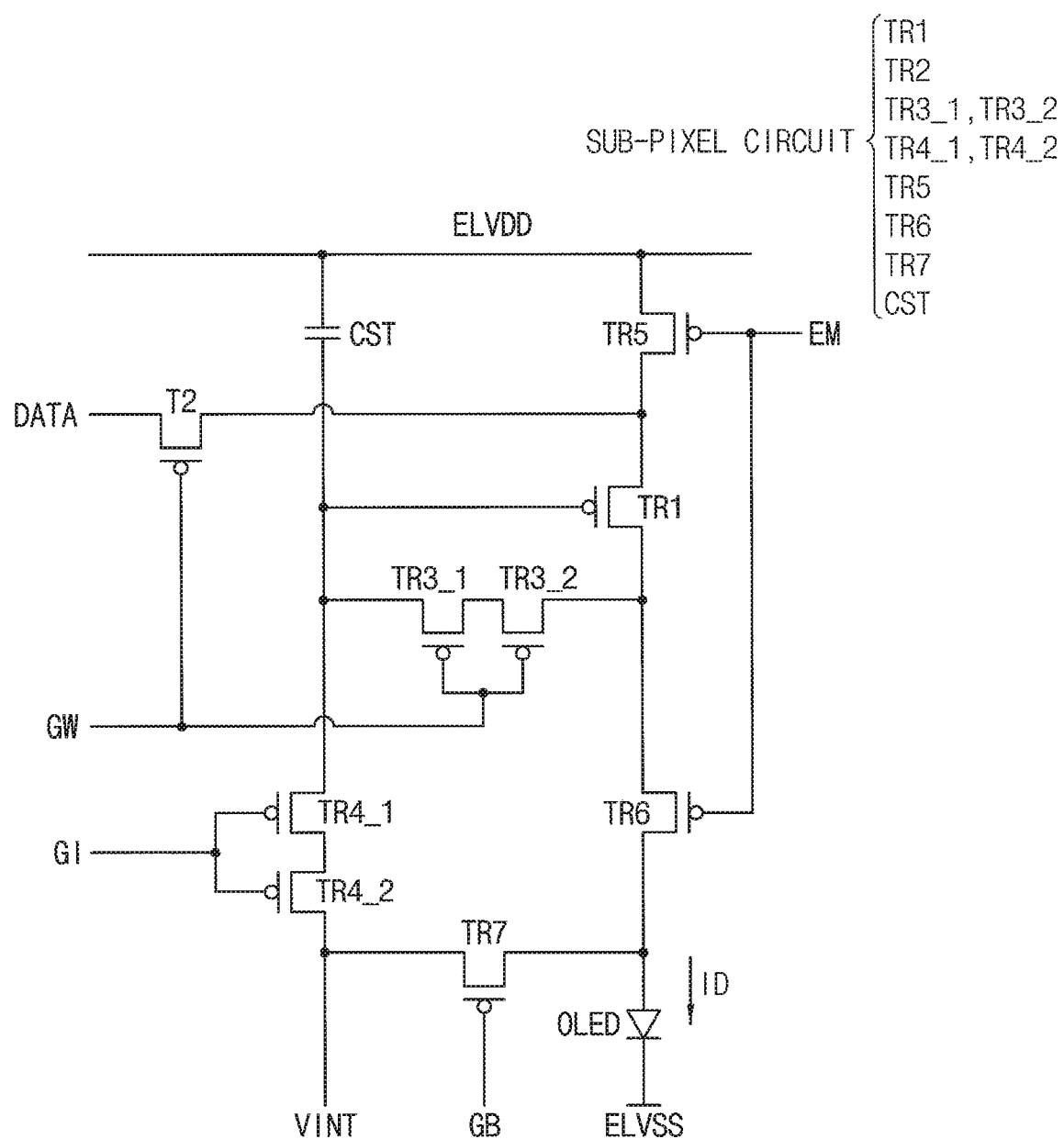
FIG. 2 is a circuit diagram illustrating a sub-pixel circuit and an OLED disposed in a sub-pixel circuit region of FIG. 1.

FIG. 2 is a circuit diagram illustrating a sub-pixel circuit and an OLED disposed in a sub-pixel circuit region of FIG. 1.

Referring to FIG. 2, a sub-pixel circuit, wirings, and an OLED (e.g., a sub-pixel structure) may be disposed in each of the first, second, and third sub-pixel circuit regions 10, 20, and 30 of the OLED display device 500. The sub-pixel circuit may include a first transistor TR1, a second transistor TR2, third transistors TR3_1 and TR3_2, fourth transistors TR4_1 and TR4_2, a fifth transistor TR5, a sixth transistor TR6, and a seventh transistor TR7 and a storage capacitor CST, and the wirings may include a high power supply voltage ELVDD wiring, a low power supply voltage ELVSS wiring, an initialization voltage VINT wiring, a data signal DATA wiring, a scan signal GW wiring, a data initialization signal GI wiring, a light emission signal EM wiring, and a diode initialization signal GB wiring. In addition, the sub-pixel circuit may further include one or more active patterns (e.g., first and second active patterns 100_1 and 100_2 of FIG. 3) that connect the first through seventh transistors TR1, TR2, TR3_1, TR3_2, TR4_1, TR4_2, TR5, TR6, and TR7 and the storage capacitor CST.

Figure 12:
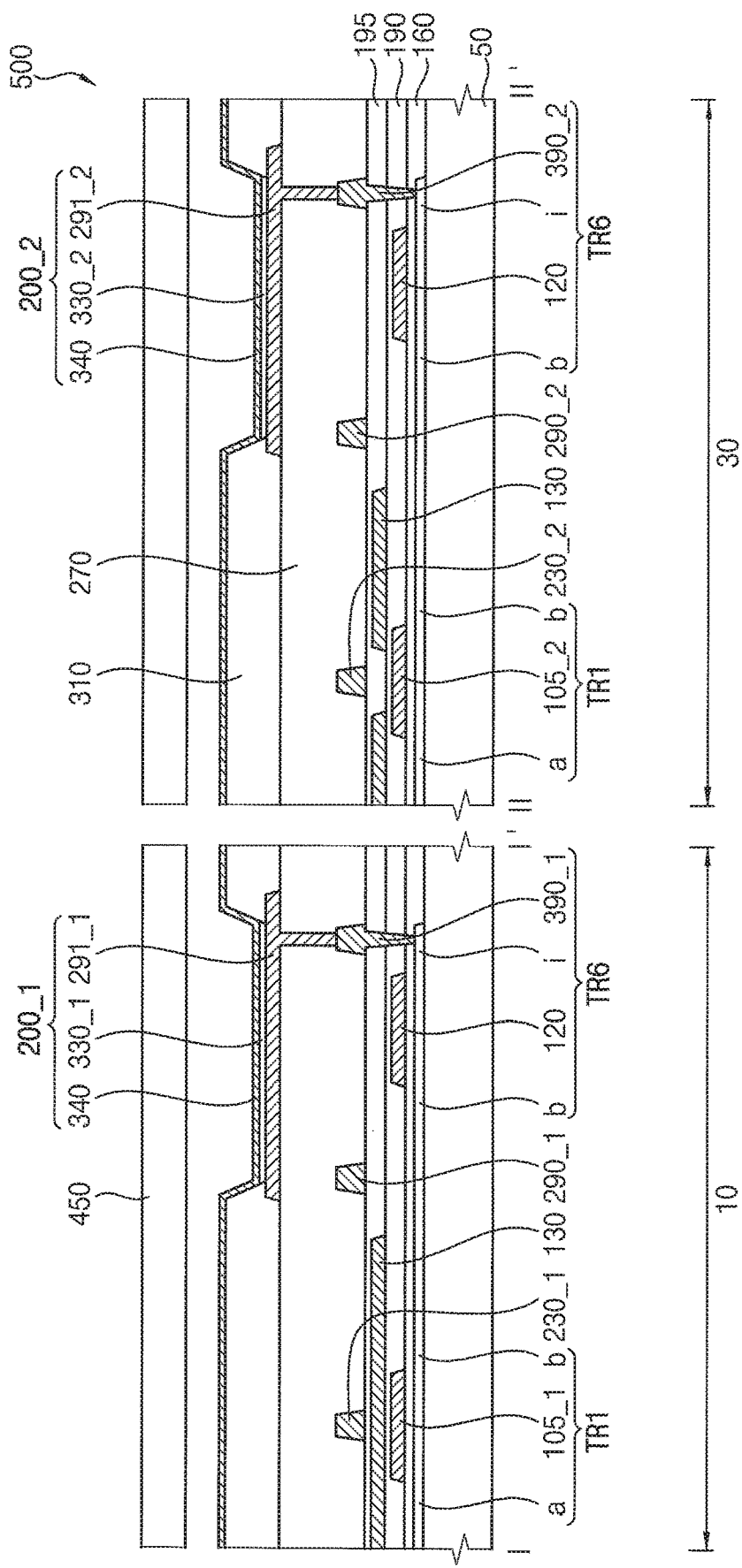
FIG. 12 is a cross-sectional view taken along a line I-I' and a line II-II' of FIG. 11.

The OLED (e.g., the first sub-pixel structure 200_1 or the second sub-pixel structure 200_2 illustrated in FIG. 12) may emit light based on a driving current ID. The OLED may include a first terminal and a second terminal. In example embodiments, the second terminal of the OLED receives a low power supply voltage ELVSS. For example, the first terminal of the OLED is an anode terminal, and the second terminal of the OLED is a cathode terminal. Alternatively, the first terminal of the OLED may be a cathode terminal, and the second terminal of the OLED may be an anode terminal. In example embodiments, the anode terminal of the OLED may correspond to the lower electrodes 291_1 and 291_2 of FIG. 12, and the cathode terminal of the OLED may correspond to the upper electrode 340 of FIG. 12.

The first transistor TR1 (e.g., the first transistor TR1 illustrated in FIG. 12) may include a gate terminal, a first terminal, and a second terminal. In example embodiments, the first terminal of the first transistor TR1 is a source terminal, and the second terminal of the first transistor TR1 is a drain terminal. Alternatively, the first terminal of the first transistor TR1 may be a drain terminal, and the second terminal of the first transistor TR1 may be a source terminal.

The driving current ID may be generated by the first transistor TR1. In example embodiments, the first transistor TR1 operates in a saturation region. In this case, the first transistor TR1 may generate the driving current ID based on a voltage difference between the gate terminal and the source terminal, and a gradation may be implemented based on an amount of the driving current ID that is generated by the first transistor TR1. Alternatively, the first transistor TR1 operates in a linear region. In this case, a gradation may be implemented based on an amount of time during which the first transistor TR1 provides the driving current ID to the OLED within one frame.

The second transistor TR2 may include a gate terminal, a first terminal, and a second terminal. The scan signal GW may be applied to the gate terminal of the second transistor TR2. The first terminal of the second transistor TR2 may receive the data signal DATA. The second terminal of the second transistor TR2 may be connected to the first terminal of the first transistor TR1. In example embodiments, the first terminal of the second transistor TR2 is a source terminal, and the second terminal of the second transistor TR2 is a drain terminal. Alternatively, the first terminal of the second transistor TR2 may be a drain terminal, and the second terminal of the second transistor TR2 may be a source terminal.

The second transistor TR2 may provide the data signal DATA to the first terminal of the first transistor TR1 while the scan signal GW is activated. In this case, the second transistor TR2 operates in a linear region.

The third transistors TR3_1 and TR3_2 may be connected in series serving as a dual transistor. For example, when the dual transistor is turned-off, a leakage current may be decreased. Herein, the third transistors TR3_1 and TR3_2 may be collectively referred to as a third transistor TR3 or a dual transistor TR3. The third transistor TR3 may include a gate terminal, a first terminal, and a second terminal. The gate terminal of the third transistor TR3 may receive the scan signal GW. The first terminal of the third transistor TR3 may be connected to the gate terminal of the first transistor TR1. The second terminal of the third transistor TR3 may be connected to the second terminal of the first transistor TR1. In example embodiments, the first terminal of the third transistor TR3 is a source terminal, and the second terminal of the third transistor TR3 is a drain terminal. Alternatively, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 while the scan signal GW is activated. In this case, the third transistor TR3 may operate in a linear region. That is, the third transistor TR3 may form a diode connection of the first transistor TR1 while the scan signal GW is activated. A voltage difference that corresponds to a threshold voltage of the first transistor TR1 between the first terminal of the first transistor TR1 and the gate terminal of the first transistor TR1 may occur due to the diode connection of the first transistor TR1. As a result, a sum of the voltage corresponding to the data signal DATA that is provided to the first terminal of the first transistor TR1 through the second transistor TR2 and the voltage difference (i.e., the threshold voltage) may be applied to the gate terminal of the first transistor TR1 while the scan signal GW is activated. Thus, the data signal DATA applied to the first transistor TR1 may be compensated as much as the threshold voltage of the first transistor TR1. The compensated data signal DATA may be applied to the gate terminal of the first transistor TR1. As a result, uniformity of the driving current ID may be improved because an effect by the threshold voltage of the first transistor TR1 is reduced.

The fourth transistor TR4_1 and the fourth transistor TR4_2 may be connected in series serving as a dual transistor. For example, when the dual transistor is turned-off, a leakage current may be decreased. Herein, the fourth transistors TR4_1 and TR4_2 may be collectively referred to as a fourth transistor TR4 or a dual transistor TR4. The fourth transistor TR4 may include a gate terminal, a first terminal, and a second terminal. An input terminal of an initialization voltage VINT is connected to the first terminal of the fourth transistor TR4 and a first terminal of the seventh transistor TR7, and an output terminal of the initialization voltage VINT is connected to the second terminal of the fourth transistor TR4 and a first terminal of the storage capacitor CST.

The gate terminal of the fourth transistor TR4 may receive the data initialization signal GI. The initialization voltage VINT may be applied to the first terminal of the fourth transistor TR4. The second terminal of the fourth transistor TR4 may be connected to the gate terminal of the first transistor TR1. In example embodiments, the first terminal of the fourth transistor TR4 is a source terminal, and the second terminal of the fourth transistor TR4 is a drain terminal. Alternatively, the first terminal of the fourth transistor TR4 may be a drain terminal, and the second terminal of the fourth transistor TR4 may be a source terminal.

The fourth transistor TR4 may apply the initialization voltage VINT to the gate terminal of the first transistor TR1 while the data initialization signal GI is activated. In this case, the fourth transistor TR4 may operate in a linear region. Thus, the fourth transistor TR4 may initialize the gate terminal of the first transistor TR1 to the initialization voltage VINT while the data initialization signal GI is activated. In example embodiments, a voltage level of the initialization voltage VINT is sufficiently lower than a voltage level of the data signal DATA that is maintained by the storage capacitor CST in a previous frame. In this case, the first transistor TR1 may be a P-channel metal oxide semiconductor (PMOS) type transistor, and the initialization voltage VINT may be applied to the gate terminal of the first transistor TR1. In some example embodiments, a voltage level of the initialization voltage VINT is sufficiently higher than the voltage level of the data signal DATA that is maintained by the storage capacitor CST in a previous frame. In this case, the first transistor TR1 may be an N-channel metal oxide semiconductor (NMOS) type transistor, and the initialization voltage VINT may be applied to the gate terminal of the first transistor TR1.

In example embodiments, the data initialization signal GI is identical to the scan signal GW, but is advanced by one horizontal time period. For example, the data initialization signal GI is applied to sub-pixels located in an (n)-th row among a plurality of sub-pixels included in the OLED display device 500 (where n is an integer of 2 or more), and the scan signal GW is applied to sub-pixels located in a (n−1)-th row among a plurality of the sub-pixels. This is, the data initialization signal GI may be applied to the sub-pixels located in the (n)-th row among the sub-pixels by applying the scan signal GW to the sub-pixels located in the (n−1)-th row among the sub-pixels. As a result, the gate terminal of the first transistor TR1 included in the sub-pixels located in the (n)-th row among the sub-pixels may be initialized to the initialization voltage VINT when the data signal DATA is applied to sub-pixels located in the (n−1)-th row among the sub-pixels.

The fifth transistor TR5 may include a gate terminal, a first terminal, and a second terminal. The light emission signal EM may be applied to the gate terminal of the fifth transistor TR5. The high power supply voltage ELVDD may be applied to the first terminal of the fifth transistor TR5. The second terminal of the fifth transistor TR5 may be connected to the first terminal of the first transistor TR1. In example embodiments, the first terminal of the fifth transistor TR5 is a source terminal, and the second terminal of the fifth transistor TR5 is a drain terminal. Alternatively, the first terminal of the fifth transistor TR5 may be a drain terminal, and the second terminal of the fifth transistor TR5 may be a source terminal.

The fifth transistor TR5 may apply the high power supply voltage ELVDD to the first terminal of the first transistor TR1 while the light emission signal EM is activated. On the other hands, the fifth transistor TR5 does not apply the high power supply voltage ELVDD while the light emission signal EM is inactivated. In this case, the fifth transistor TR5 may operate in a linear region. The fifth transistor TR5 may apply the high power supply voltage ELVDD to the first terminal of the first transistor TR1 while the light emission signal EM is activated such that the first transistor TR1 generates the driving current ID. In addition, the fifth transistor TR5 does not apply the high power supply voltage ELVDD while the light emission signal EM is inactivated such that the data signal DATA that is applied to the first terminal of the first transistor TR1 is applied to the gate terminal of the first transistor TR1.

The sixth transistor TR6 (e.g., the sixth transistor TR6 illustrated in FIG. 12) may include a gate terminal, a first terminal, and a second terminal. The light emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. In example embodiments, the first terminal of the sixth transistor TR6 is a source terminal, and the second terminal of the sixth transistor TR6 is a drain terminal. Alternatively, the first terminal of the sixth transistor TR6 may be a drain terminal, and the second terminal of the sixth transistor TR6 may be a source terminal.

The sixth transistor TR6 may provide the driving current ID generated by the first transistor TR1 to the OLED while the light emission signal EM is activated. In this case, the sixth transistor TR6 may operate in a linear region. That is, the sixth transistor TR6 may provide the driving current ID generated by the first transistor TR1 to the OLED while the light emission signal EM is activated such that the OLED emits light. In addition, the sixth transistor TR6 may disconnect the first transistor TR1 from the OLED while the light emission signal EM is inactivated such that the compensated data signal DATA that is applied to the second terminal of the first transistor TR1 is applied to the gate terminal of the first transistor TR1.

The seventh transistor TR7 may include a gate terminal, a first terminal, and a second terminal. The diode initialization signal GB may be applied to the gate terminal of the seventh transistor TR7. The initialization voltage VINT may be applied to the first terminal of the seventh transistor TR7. The second terminal of the seventh transistor TR7 may be connected to the first terminal of the OLED. In example embodiments, the first terminal of the seventh transistor TR7 is a source terminal, and the second terminal of the seventh transistor TR7 is a drain terminal. Alternatively, the first terminal of the seventh transistor TR7 may be a drain terminal, and the second terminal of the seventh transistor TR7 may be a source terminal.

The seventh transistor TR7 may apply the initialization voltage VINT to the first terminal of the OLED while the diode initialization signal GB is activated. In this case, the seventh transistor TR7 may operate in a linear region. That is, the seventh transistor TR7 may initialize the first terminal of the OLED to the initialization voltage VINT while the diode initialization signal GB is activated.

According to some embodiments, the data initialization signal GI and the diode initialization signal GB are the substantially same signal. An initialization operation of the gate terminal of the first transistor TR1 may not affect an initialization operation of the first terminal of the OLED. That is, the initialization operation of the gate terminal of the first transistor TR1 and the initialization operation of the first terminal of the OLED may be independent from each other. When the data initialization signal GI is used as the diode initialization signal GB or vice versa, thereby improving the manufacturing efficiency of the sub-pixel circuit.

The storage capacitor CST may include the first terminal and the second terminal, and may be connected between the high power supply voltage ELVDD wiring and the gate terminal of the first transistor TR1. For example, the first terminal of the storage capacitor CST may be connected to the gate terminal of the first transistor TR1, and the second terminal of the storage capacitor CST may be connected to the high power supply voltage ELVDD wiring. The storage capacitor CST may maintain a voltage level of the gate terminal of the first transistor TR1 while the scan signal GW is inactivated. The light emission signal EM may be activated while the scan signal GW is inactivated. The driving current ID generated by the first transistor TR1 may be provided to the OLED while the light emission signal EM is activated. Therefore, the driving current ID generated by the first transistor TR1 may be provided to the OLED based on the voltage level maintained by the storage capacitor CST.

Figure 3:
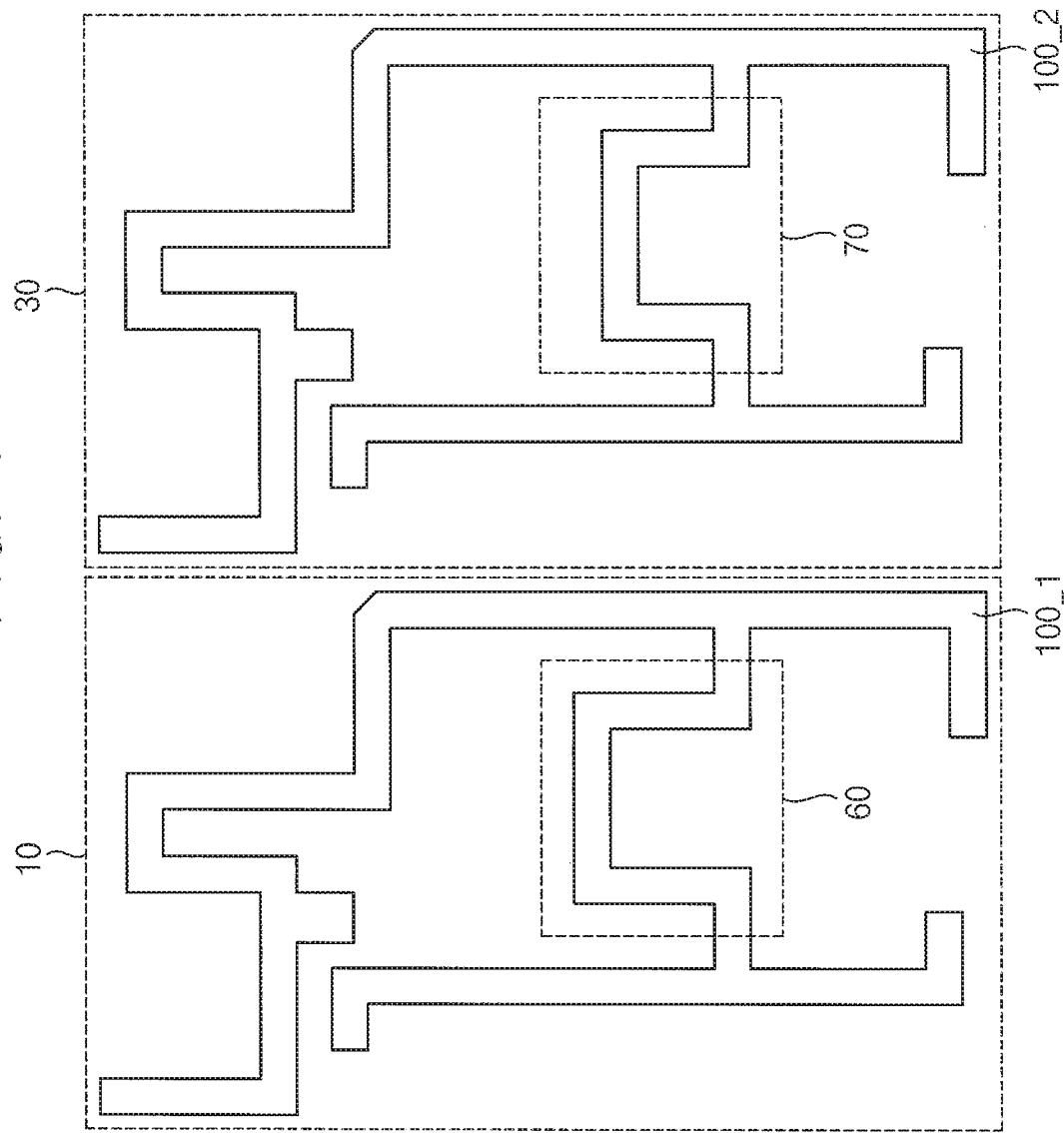
FIG. 3 is a layout diagram illustrating a first sub-pixel circuit region and a second sub-pixel circuit region of a substrate included in the OLED display device of FIG. 1.
Figure 4:
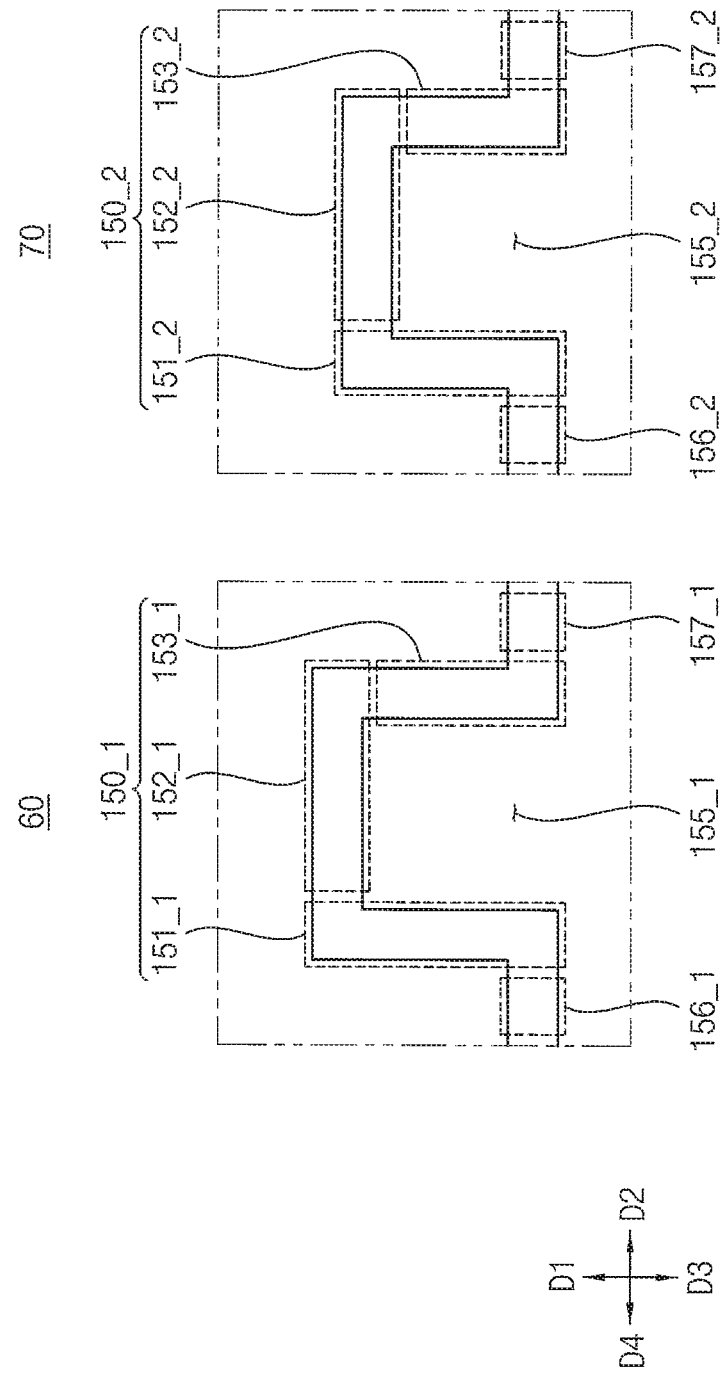
FIGS. 4 and 5 are layout diagrams for describing active patterns disposed in driving transistor regions of FIG. 3.
Figure 5:
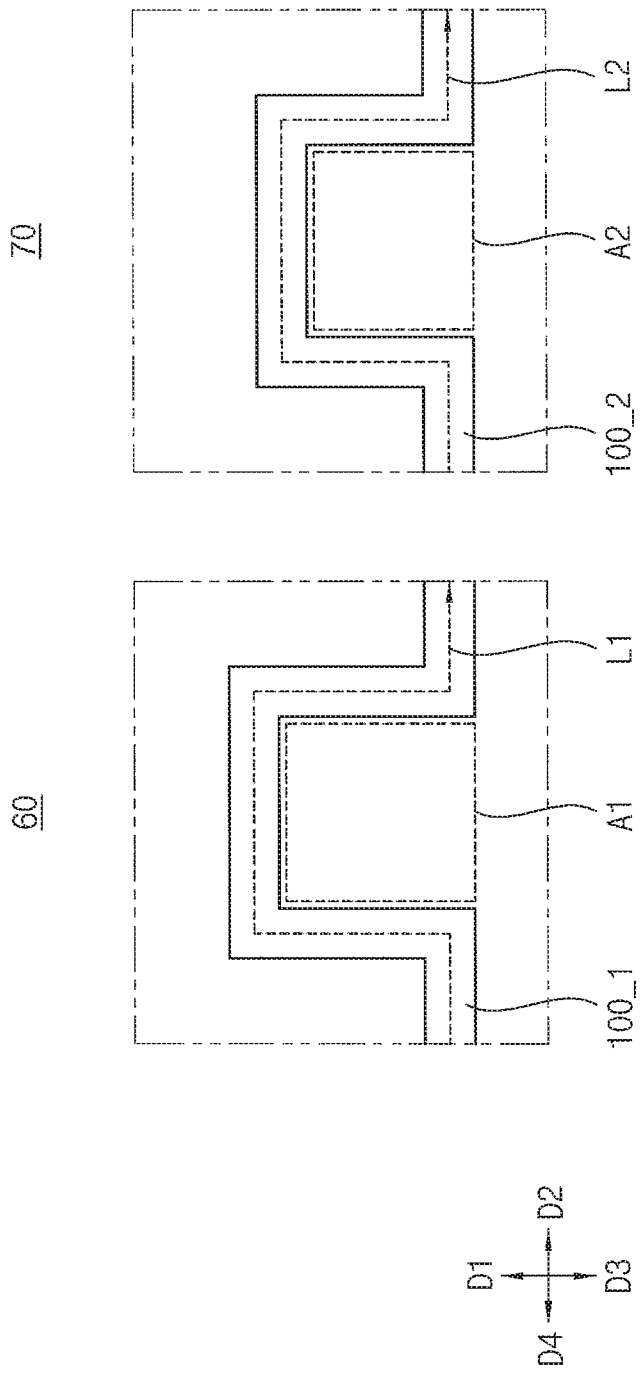
Figure 6:
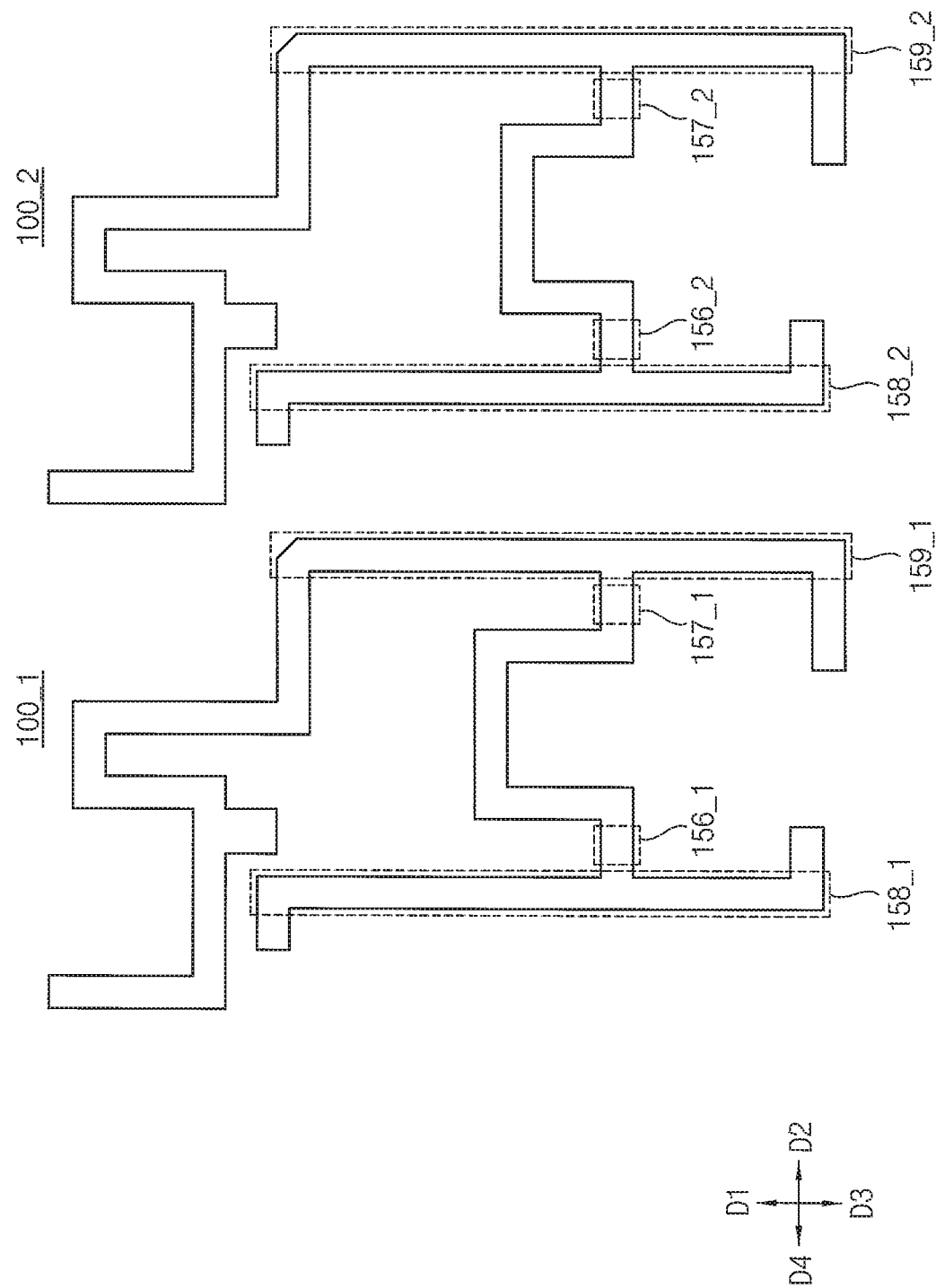
FIG. 6 is a layout diagram for describing active patterns of FIG. 3.

FIG. 3 is a layout diagram illustrating a first sub-pixel circuit region and a second sub-pixel circuit region of a substrate included in the OLED display device of FIG. 1, and FIGS. 4 and 5 are layout diagrams for describing active patterns disposed in driving transistor regions of FIG. 3. FIG. 6 is a layout diagram for describing active patterns of FIG. 3. For the convenience of description, elements included in the OLED display device 500 of FIG. 1 may not be illustrated in FIGS. 3 through 6.

Referring to FIGS. 3, 4, 5, and 6, the OLED display device 500 may include a first active pattern 100_1 and a second active pattern 100_2. In example embodiments, the first active pattern 100_1 may include a first bent portion 150_1, and a first recess 155_1 in a direction of a plan surface (e.g., the first direction D1) may be formed in the first bent portion 150_1. Similarly, the second active pattern 100_2 may include a second bent portion 150_2, and a second recess 155_2 in the direction of the plan surface may be formed in the second bent portion 150_2. Referring to FIG. 5, the first recess 155_1 may have a first area A1, and the second recess 155_2 may have a second area A2. In some embodiments, the second area A2 may be less than the first area A1. Further, the first active pattern 100_1 may have a first distance (or length) L1 in a first driving transistor region 60, and the second active pattern 100_2 may have a second distance (or length) L2 in a second driving transistor region 70. In some embodiments, the second distance L2 may be less than the first distance L1.

As the second active pattern 100_2 of the OLED display device 500 has a relatively small second area A2 or a relatively small second distance L2 in the second driving transistor region 70, the OLED display device 500 may serve as an OLED display device capable of improving a visibility.

As illustrated in FIG. 3, the OLED display device 500 (or the substrate 50 of the OLED display device 500) may have a sub-pixel circuit region 10 and another sub-pixel circuit region 30. FIG. 3 shows only two sub-pixel circuit regions 10 and 30 omitting the second sub-pixel circuit region 20 of FIG. 1, it is understood that the sub-pixel circuit region 10 of FIG. 3 may represent either the first sub-pixel circuit region 10 or the second sub-pixel circuit region 20 of FIG. 1. Hereinafter, for the convenience of description, the sub-pixel circuit region 10 illustrated in FIG. 3 may be referred to as the first sub-pixel circuit region 10 representing either the first sub-pixel circuit region 10 or the second sub-pixel circuit region 20 of FIG. 1, and the sub-pixel circuit region 30 of FIG. 3 is referred to as the second sub-pixel circuit region 30 representing the third sub-pixel circuit region 30 of FIG. 1. For further clarification, the first sub-pixel circuit region 10 of FIG. 3 may correspond to a region where i) the first sub-pixel circuit and the first sub-pixel structure capable of emitting a red color of light or ii) the second sub-pixel circuit and second sub-pixel structure capable of emitting a green color of light are disposed, and the second sub-pixel circuit region 30 of FIG. 3 may correspond to a region where the third sub-pixel circuit and the third sub-pixel structure capable of emitting a blue color of light is disposed. In other words, the red or green color of light may be emitted in the first sub-pixel circuit region 10 of FIG. 3, and the blue color of light may be emitted in the second sub-pixel circuit region 30 of FIG. 3. The first sub-pixel circuit region 10 may include the first driving transistor region 60, and a region except for the first driving transistor region 60 of the first sub-pixel circuit region 10 (or a region surrounding the first driving transistor region 60) may be defined as a first switching transistor region. Similarly, the second sub-pixel circuit region 30 may include the second driving transistor region 70, and a region except for the second driving transistor region 70 of the second sub-pixel circuit region 30 (or a region surrounding the second driving transistor region 70) may be defined as a second switching transistor region. The first active pattern 100_1 may be disposed in the first sub-pixel circuit region 10, and the second active pattern 100_2 may be disposed in the second sub-pixel circuit region 30. The first bent portion 150_1 of the first active pattern 100_1 may be located in the first driving transistor region 60, and the second bent portion 150_2 of the second active pattern 100_2 may be located in the second driving transistor region 70. Switching transistors, which will be described below, may be disposed in each of the first and second switching transistor regions.

As illustrated in FIGS. 4 and 5, in the first driving transistor region 60 of the first sub-pixel circuit region 10, the first bent portion 150_1 may include a first extension 151_1, a second extension 152_1, and a third extension 153_1. The first extension 151_1 may extend in the first direction D1 that is perpendicular to an upper surface of the substrate 50, and the second extension 152_1 may extend from a first distal end of the first extension 151_1 in the second direction D2 that is perpendicular to the first direction D1. The third extension 153_1 may extend from a first distal end of the second extension 152_1 in a third direction D3 that is perpendicular to the second direction D2 and is opposite to the first direction D1. The first extension 151_1, the second extension 152_1, and the third extension 153_1 may be integrally formed. A space (e.g., the first area A1 of FIG. 5) formed by the first extension 151_1, the second extension 152_1, and the third extension 153_1 may be defined as the first recess 155_1. For example, the first active pattern 100_1 may have a shape that is bent in the first direction D1 in the first driving transistor region 60.

The first active pattern 100_1 may have the first distance L1 in the first driving transistor region 60, and the first transistor TR1 disposed in the first driving transistor region 60 may have a relatively large driving range because the first distance L1 is longer than the second distance L2. For example, a first gate electrode (e.g., the first gate electrode 105_1 illustrated in FIG. 7) may be disposed in the first driving transistor region 60 overlapping the first active pattern 100_1, and the first active pattern 100_1 that overlaps the first gate electrode may serve as a channel of a first driving transistor. That is, a distance of the first active pattern 100_1 that overlaps the first gate electrode may correspond to the first distance L1.

In the second driving transistor region 70 of the second sub-pixel circuit region 30, the second bent portion 150_2 may include a fourth extension 151_2, a fifth extension 152_2, and a sixth extension 153_2. The fourth extension 151_2 may extend in the first direction D1, and the fifth extension 152_2 may extend from a first distal end of the fourth extension 151_2 in the second direction D2. The sixth extension 153_2 may extend from a first distal end of the fifth extension 152_2 in the third direction D3. The fourth extension 151_2, the fifth extension 152_2, and the sixth extension 153_2 may be integrally formed. A space (e.g., the second area A2 of FIG. 5) formed by the fourth extension 151_2, the fifth extension 152_2, and the sixth extension 153_2 may be defined as the second recess 155_2. For example, the second active pattern 100_2 may have a shape that is bent in the first direction D1 in the second driving transistor region 70.

The second active pattern 100_2 may have the second distance L2 in the second driving transistor region 70, and the first transistor TR1 disposed in the second driving transistor region 70 may have a relatively small driving range because the second distance L2 is shorter than the first distance L1. For example, a second gate electrode (e.g., the second gate electrode 105_2 illustrated in FIG. 7) may be disposed in the second driving transistor region 70 overlapping the second active pattern 100_2, and the second active pattern 100_2 that overlaps the second gate electrode may serve as a channel of a second driving transistor, which will be described below. That is, a distance of the second active pattern 100_2 that overlaps the second gate electrode may correspond to the second distance L2.

A correlation between luminance and gradation data of the OLED display device 500 may be defined according to a gamma curve. An accurate gamma setting may be required for the OLED display device 500 to maintain a stable display quality. When an error occurs in the gamma setting, a deviation may occur between an actual luminance and the luminance corresponding to the gradation data. To minimize this deviation, multi-time programming ("MTP") may be performed to program a reference gamma voltage in real time. The reference gamma voltage may be a voltage input to a driving circuit that generates a data signal where the luminance is determined. According to the gradation data, the driving circuit may generate a data signal using the reference gamma voltage, and the OLED may emit light according to the data signal.

In the OLED display device 500 using a full scale data ("FSD") method, when the OLED display device 500 displays an image at a low gray level (or a low gradation, a low gray scale), the MTP defect may occur due to an insufficient data output voltage of the blue sub-pixel because a data margin of a blue sub-pixel (e.g., the blue sub-pixel disposed in the second sub-pixel circuit region 30 of FIG. 3) is relatively small. To improve the MTP defect, a driving range of the driving transistor (e.g., the first transistor TR1 disposed in the second sub-pixel circuit region 30 of FIG. 3) included in the blue sub-pixel may be reduced. As a distance (e.g., the second distance L2 of the second active pattern 100_2 located in the second driving transistor region 70 of FIG. 5) of an active pattern of the driving transistor is decreased, the driving range may be reduced. In this case, a voltage margin of the blue sub-pixel may be correspondingly increased. In example embodiments, when a distance of an active pattern of the driving transistor (e.g., the second distance L2 of the second active pattern 100_2 illustrated in FIG. 5) is decreased from about 23.3 micrometers (e.g., a distance of a conventional active pattern) to about 21.3 micrometers, the data voltage margin of the blue sub-pixel may be increased from about 0.03 volts to about 0.3 volts. Accordingly, when the OLED display device 500 displays an image at a low gray level (e.g., a black color), the MTP defect of the OLED display device 500 may be improved.

As illustrated in FIG. 6, the first active pattern 100_1 may further include a seventh extension 158_1 and a first protrusion 156_1. The seventh extension 158_1 may be spaced apart from the first bent portion 150_1 in a fourth direction D4 that is opposite to the second direction D2, and may extend in the first direction D1. The first protrusion 156_1 may be protruded from the seventh extension 158_1 in the second direction D2. For example, the seventh extension 158_1 may be disposed in the switching transistor region of the first sub-pixel circuit region 10, and the first protrusion 156_1 may be disposed in a portion of the switching transistor region of the first sub-pixel circuit region 10 and a portion of the first driving transistor region 60. The first protrusion 156_1 may be coupled to a second distal end of the first extension 151_1 that is opposite to the first distal end of the first extension 151_1. The first bent portion 150_1, the seventh extension 158_1, and the first protrusion 156_1 may be integrally formed.

The second active pattern 100_2 may further include an eighth extension 158_2 and a second protrusion 156_2. The eighth extension 158_2 may be spaced apart from the second bent portion 150_2 in the fourth direction D4, and may extend in the first direction D1. The second protrusion 156_2 may be protruded from the eighth extension 158_2 in the second direction D2. For example, the eighth extension 158_2 may be disposed in the switching transistor region of the second sub-pixel circuit region 30, and the second protrusion 156_2 may be disposed in a portion of the switching transistor region of the second sub-pixel circuit region 30 and a portion of the second driving transistor region 70. The second protrusion 156_2 may be coupled to a second distal end of the fourth extension 151_2 that is opposite to the first distal end of the fourth extension 151_2. The second bent portion 150_2, the eighth extension 158_2, and the second protrusion 156_2 may be integrally formed.

The first active pattern 100_1 may further include a ninth extension 159_1 and a third protrusion 157_1. The ninth extension 159_1 may be spaced apart from the first bent portion 150_1 in the second direction D2, and may extend in the first direction D1. The third protrusion 157_1 may be protruded from the ninth extension 159_1 in the fourth direction D4. For example, the ninth extension 159_1 may be disposed in the switching transistor region of the first sub-pixel circuit region 10, and the third protrusion 157_1 may be disposed in a portion of the switching transistor region of the first sub-pixel circuit region 10 and a portion of the first driving transistor region 60. The third protrusion 157_1 may be coupled to a distal end of the third extension 153_1. The first bent portion 150_1, the ninth extension 159_1, and the third protrusion 157_1 may be integrally formed.

The second active pattern 100_2 may further include a tenth extension 159_2 and a fourth protrusion 157_2. The tenth extension 159_2 may be spaced apart from the second bent portion 150_2 in the second direction D2, and may extend in the first direction D1. The fourth protrusion 157_2 may be protruded from the tenth extension 159_2 in the fourth direction D4. For example, the tenth extension 159_2 may be disposed in the switching transistor region of the second sub-pixel circuit region 30, and the fourth protrusion 157_2 may be disposed in a portion of the switching transistor region of the second sub-pixel circuit region 30 and a portion of the second driving transistor region 70. The fourth protrusion 157_2 may be coupled to a distal end of the sixth extension 153_2. The second bent portion 150_2, the tenth extension 159_2, and the fourth protrusion 157_2 may be integrally formed.

In example embodiments, the first distance L1 illustrated in FIG. 5 may correspond to a total distance (or length) of the first and third protrusions 156_1 and 157_1, the first extension 151_1, the second extension 152_1, and the third extension 153_1 that are located in the first driving transistor region 60. Similarly, the second distance L2 illustrated in FIG. 5 may correspond to a total distance (or length) of the second and fourth protrusions 156_2 and 157_2, the fourth extension 151_2, the fifth extension 152_2, and the sixth extension 153_2 that are located in the second driving transistor region 70.

As illustrated in FIG. 6, the first active pattern 100_1 and the second active pattern 100_2 may further include additional extensions and additional protrusions, and a shape of each of the first active pattern 100_1 and the second active pattern 100_2 that are illustrated in FIG. 6 may be defined by the additional extensions and the additional protrusions.

Figure 9:
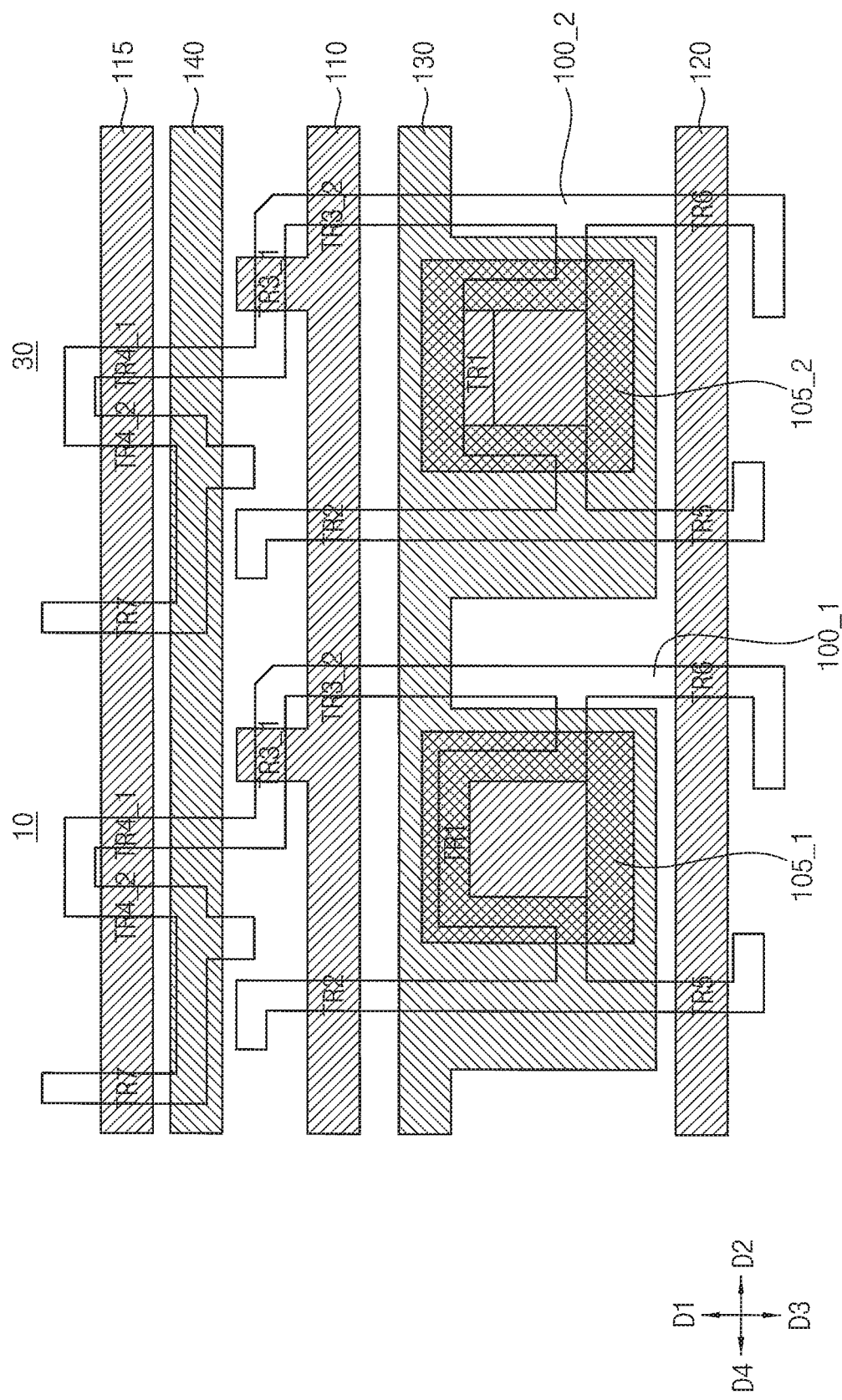
Figure 10:
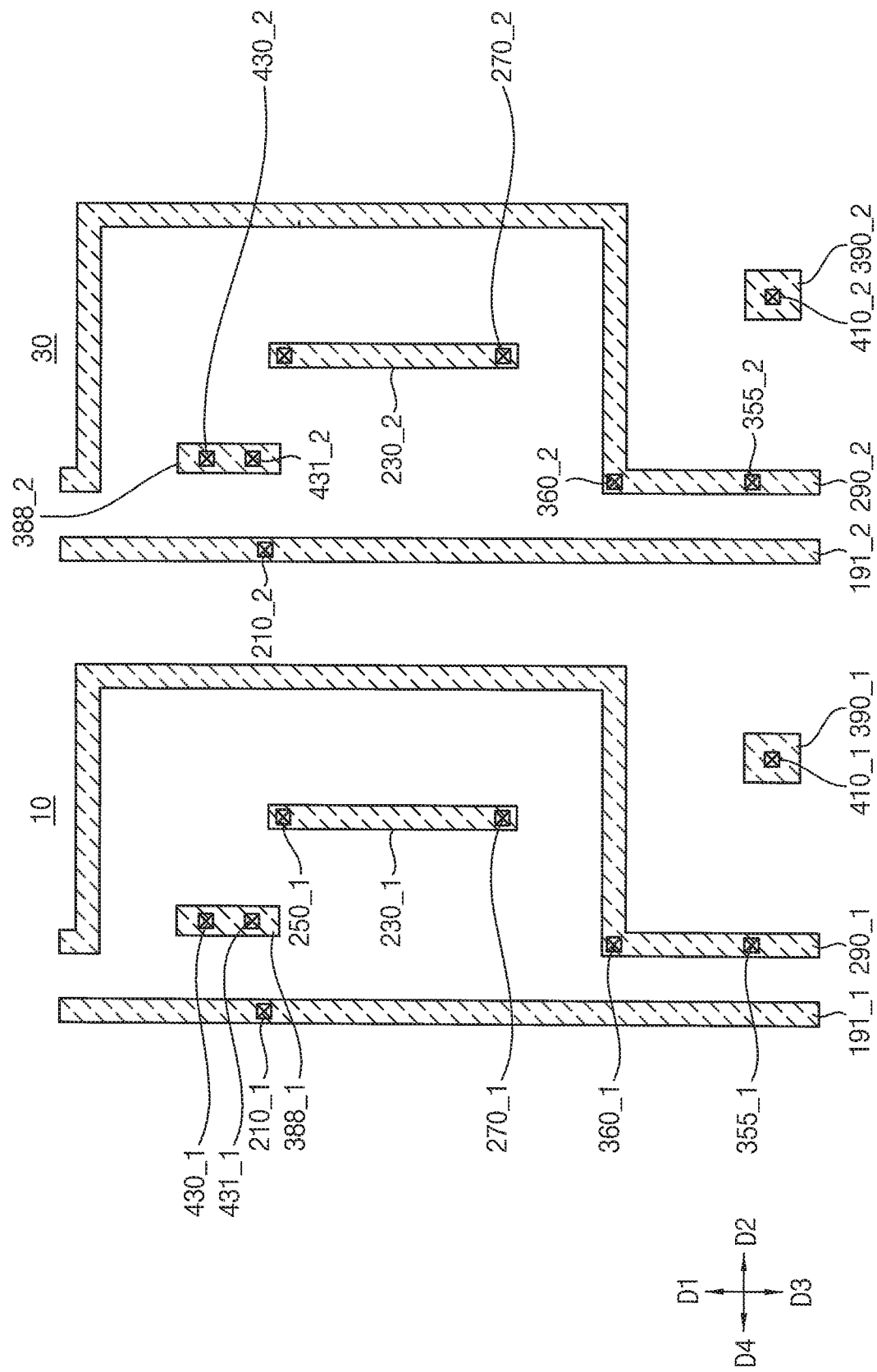
Figure 11:
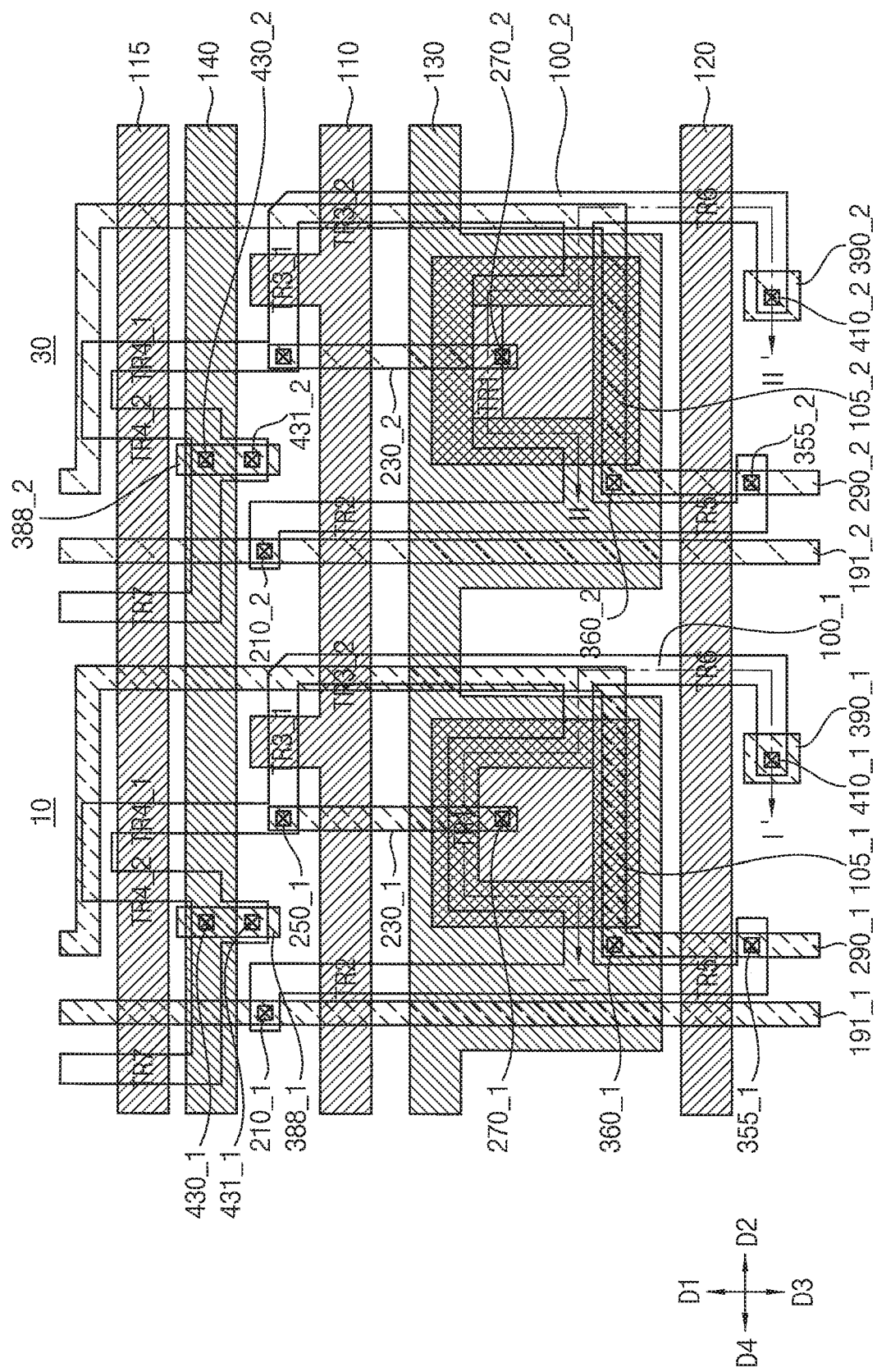

FIGS. 7 through 11 are layout diagrams for describing the OLED display device of FIG. 1, and FIG. 12 is a cross-sectional view taken along a line I-I' and a line II-II' of FIG. 11.

Figure 7:
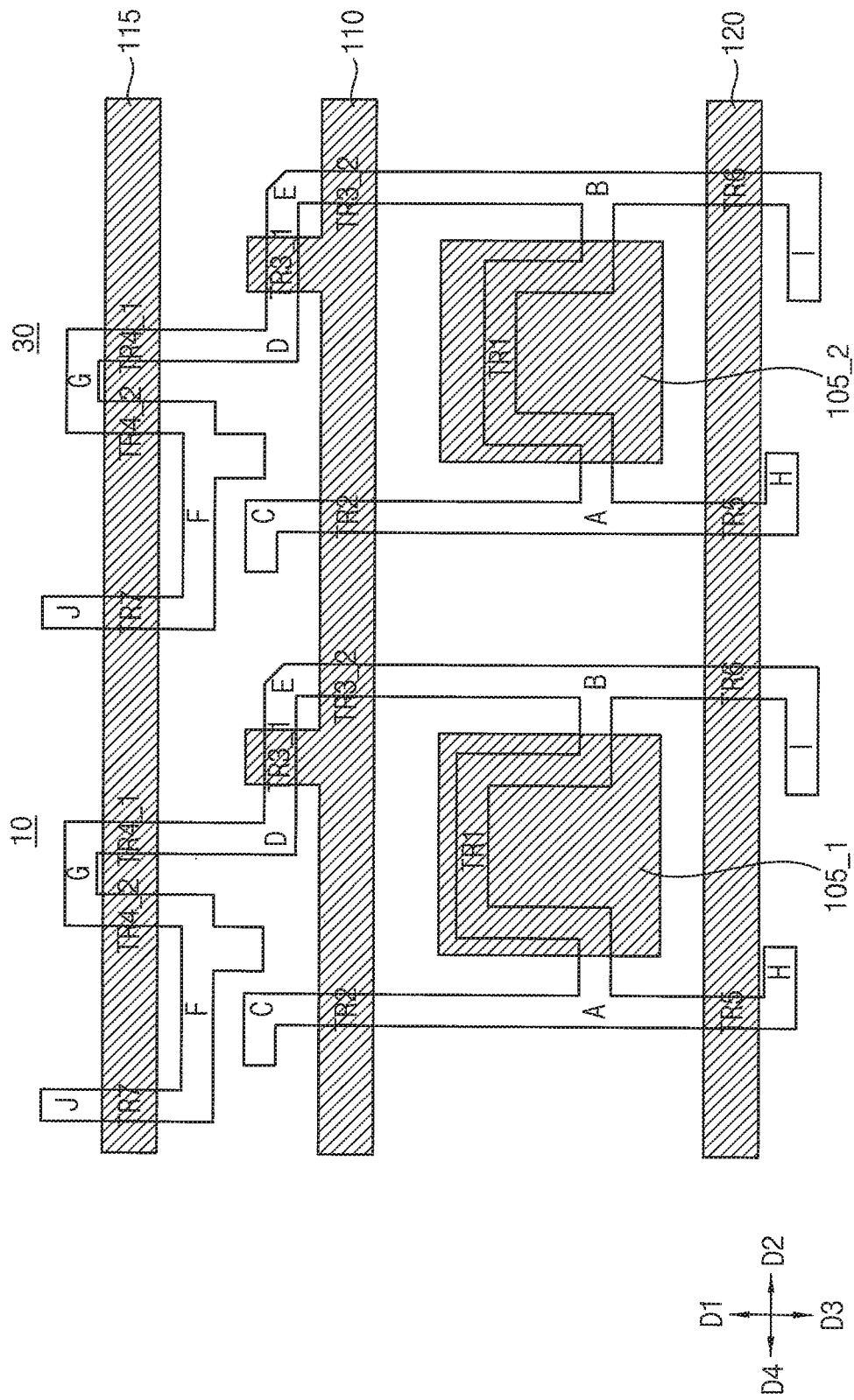

Referring to FIGS. 7 and 12, the OLED display device 500 may include the substrate 50, the first active pattern 100_1, the second active pattern 100_2, a gate insulation layer 160, a first gate electrode 105_1, a second gate electrode 105_2, a first gate wiring 110, a second gate wiring 115, and a third gate wiring 120.

The substrate 50 may include a transparent material or an opaque material. For example, the substrate 50 may include a quartz substrate, a synthetic quartz substrate, a calcium fluoride substrate, a fluoride-doped quartz substrate, a soda-lime glass substrate, or a non-alkali glass substrate. The substrate 50 may be divided into the first sub-pixel circuit region 10 and the second sub-pixel circuit region 30. Alternatively, the substrate 50 may include a flexible transparent resin substrate.

A buffer layer (not shown) may be disposed on the substrate 50. In some embodiments, the buffer layer may be disposed on the entire substrate 50. The buffer layer may prevent the diffusion of metal atoms and/or impurities from the substrate 50 into transistors (e.g., the first through seventh transistors TR1, TR2, TR3_1, TR3_2, TR4_1, TR4_2, TR5, TR6, and TR7) and first and second sub-pixel structures 200_1 and 200_2. In addition, the buffer layer may control a rate of heat transfer in a crystallization process for forming the first active pattern 100_1 and the second active pattern 100_2 to obtain substantial uniformity in the first and second active patterns 100_1 and 100_2. Further, the buffer layer may improve a surface flatness of the substrate 50. Depending on a type of the substrate 50, at least two buffer layers may be provided on the substrate 50, or the buffer layer may not be disposed. For example, the buffer layer may include an organic material or an inorganic material.

The first active pattern 100_1 and the second active pattern 100_2 may be disposed on the substrate 50. The first active pattern 100_1 may be disposed in the first sub-pixel circuit region 10 on the substrate 50, and the second active pattern 100_2 may be disposed in the second sub-pixel circuit region 30 on the substrate 50. Each of the first and second active patterns 100_1 and 100_2 may include an oxide semiconductor, an inorganic semiconductor (e.g., amorphous silicon, polysilicon), and an organic semiconductor. In example embodiments, each of the first and second active patterns 100_1 and 100_2 may include an oxide semiconductor layer including at least one of two-component compound (ABx), ternary compound (ABxCy), and four-component compound (ABxCyDz). These compounds may contain indium (In), zinc (Zn), gallium (Ga), tin (Sn), titanium (Ti), aluminum (Al), hafnium (Hf), zirconium (Zr), and magnesium (Mg). For example, each of the first and second active patterns 100_1 and 100_2 may include at least one of zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), and indium-gallium-tin oxide (IGTO). The first active pattern 100_1 and the second active pattern 100_2 may be disposed on the same layer, and may be simultaneously (or concurrently) formed using the same material.

Each of the first and second active patterns 100_1 and 100_2 may include first through tenth regions A, B, C, D, E, F, G, H, I, and J (e.g., regions where the first gate electrode 105_1, the second gate electrode 105_2, the first gate wiring 110, the second gate wiring 115, and the third gate wiring 120 do not overlap the first and second active patterns 100_1 and 100_2). The first through tenth regions A, B, C, D, E, F, G, H, I, and J may be doped with an impurity to have electrical conductivity higher than those of other regions of each of the first and second active patterns 100_1 and 100_2. The first through tenth regions A, B, C, D, E, F, G, H, I, and J may correspond to source terminals or drain terminals of the first through seventh transistors TR1, TR2, TR3, TR4, TR5, TR6, and TR7. The first through tenth regions A, B, C, D, E, F, G, H, I, and J may be electrically connected to each other.

The gate insulation layer 160 may be disposed on the first and second active patterns 100_1 and 100_2. The gate insulation layer 160 may cover the first and second active patterns 100_1 and 100_2 in the first and second sub-pixel circuit regions 10 and 30 on the substrate 50. In some embodiments, the gate insulation layer 160 may be entirely disposed on the entire substrate 50. For example, the gate insulation layer 160 may sufficiently cover the first and second active patterns 100_1 and 100_2 on the substrate 50, and may have a substantially flat upper surface planarizing a step around the first and second active patterns 100_1 and 100_2. Alternatively, the gate insulation layer 160 may cover the first and second active patterns 100_1 and 100_2 on the substrate 50 with a substantially uniform thickness along a profile of the first and second active patterns 100_1 and 100_2. The gate insulation layer 160 may include a silicon compound and/or a metal oxide. For example, the gate insulation layer 160 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), or titanium oxide (TiOx). These may be used alone or in a suitable combination thereof.

The first gate electrode 105_1, the second gate electrode 105_2, the first gate wiring 110, the second gate wiring 115, and the third gate wiring 120 may be disposed on the gate insulation layer 160. In some embodiments, the first gate electrode 105_1, the second gate electrode 105_2, the first gate wiring 110, the second gate wiring 115, and the third gate wiring 120 may be disposed on the same layer. Each of the first gate electrode 105_1, the second gate electrode 105_2, the first gate wiring 110, the second gate wiring 115, and the third gate wiring 120 may include one or more of a metal, a metal alloy, a metal nitride, a conductive metal oxide, and a transparent conductive material. For example, each of the first gate electrode 105_1, the second gate electrode 105_2, the first gate wiring 110, the second gate wiring 115, and the third gate wiring 120 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Jr), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), or indium zinc oxide (IZO). These may be used alone or in a suitable combination thereof. The first gate electrode 105_1, the second gate electrode 105_2, the first gate wiring 110, the second gate wiring 115, and the third gate wiring 120 may be simultaneously formed using the same material. Alternatively, each of the first gate electrode 105_1, the second gate electrode 105_2, the first gate wiring 110, the second gate wiring 115, and the third gate wiring 120 may have a multi-layered structure including a plurality of layers.

The first gate electrode 105_1 may be disposed in the first driving transistor region 60 of the first sub-pixel circuit region 10, and the second gate electrode 105_2 may be disposed in the second driving transistor region 70 of the second sub-pixel circuit region 30. For example, each of the first gate electrode 105_1 and the second gate electrode 105_2 may constitute (or form or define) the first transistor TR1 (e.g., a driving transistor) together with the first and second regions A and B. In example embodiments, the first region A may be a source region, and the second region B may be a drain region. Alternatively, the first region A may be a drain region, and the second region B may be a source region. The first region A and the second region B may be doped with an impurity. However, a region of the first and second active patterns 100_1 and 100_2 that are located under the first and second gate electrodes 105_1 and 105_2 may not be doped with an impurity. In other words, a region (e.g., the first driving transistor region 60 and the second driving transistor region 70) of the first and second active patterns 100_1 and 100_2 on which the first and second gate electrodes 105_1 and 105_2 overlap may not be doped with an impurity. For example, the first region A and the second region B may operate as conductors, and the first driving transistor region 60 and the second driving transistor region 70 may operate as a channel of the first transistor TR1. Accordingly, the first transistor TR1 may be capable of generating the driving current ID of FIG. 2 provided to each of the first and second sub-pixel structures 200_1 and 200_2 (e.g., the OLED of FIG. 2), and each of the first and second sub-pixel structures 200_1 and 200_2 may emit light based on the driving current ID.

The first gate wiring 110 may include a gate extension and a gate protrusion that are located on the first and second active patterns 100_1 and 100_2 and the gate insulation layer 160. The gate extension may extend in the second direction D2, and the gate protrusion may be protruded from the gate extension in the first direction D1. The gate protrusion may constitute the third transistor TR3_1 together with the fourth region D and the fifth region E. For example, the gate protrusion may serve as a gate electrode of the third transistor TR3_1. The gate extension may include a first portion and a second portion. The first portion of the gate extension may overlap the ninth extension 159_1 and the tenth extension 159_2, and the second portion of the gate extension may overlap seventh extension 158_1 and the eighth extension 158_2 (refer to FIGS. 6 and 7). The first portion of the gate extension may constitute the third transistor TR3_2 together with the second region B and the fifth region E, and the second portion of the gate extension may constitute the second transistor TR2 (e.g., a switching transistor) together with the first region A and the third region C. The third transistors TR3_1 and TR3_2 may be connected in series serving as a dual gate transistor. For example, when the dual transistor is turned-off, a leakage current may be decreased. In this case, the third transistors TR3_1 and TR3_2 may be electrically connected via the fifth region E. In addition, the first transistor TR1, the second transistor TR2, and the fifth transistor TR5 may be electrically connected via the first region A, and the first transistor TR1, the third transistor TR3_2, and the sixth transistor TR6 may be electrically connected via the second region B.

The first region A, the second region B, the third region C, the fourth region D, and the fifth region E may be doped with an impurity. However, regions of the first and second active patterns 100_1 and 100_2 under the first gate wiring 110 may not be doped with an impurity. Thus, the first region A, the second region B, the third region C, the fourth region D, and the fifth region E may operate as conductors, and the regions of the first and second active patterns 100_1 and 100_2 under the first gate wiring 110 may operate as channels of the second transistor TR2 and the third transistors TR3_1 and TR3_2. In example embodiments, the first gate wiring 110 may receive the scan signal GW as illustrated in FIG. 2.

In example embodiments, each of the third region C of the second transistor TR2, the fourth region D of the third transistor TR3_1, and the fifth region E of the third transistor TR3_2 may be a source region, and each of the first region A of the second transistor TR2, the fifth region E of the third transistor TR3_1, and the second region B of the third transistor TR3_2 may be a drain region. Alternatively, each of the third region C of the second transistor TR2, the fourth region D of the third transistor TR3_1, and the fifth region E of the third transistor TR3_2 may be a drain region, and each of the first region A of the second transistor TR2, the fifth region E of the third transistor TR3_1, and the second region B of the third transistor TR3_2 may be a source region.

The second gate wiring 115 may extend in the second direction D2 on the first and second active patterns 100_1 and 100_2 and the gate insulation layer 160. The second gate wiring 115 may constitute the seventh transistor TR7 together with the sixth region F and the tenth region J and the fourth transistor TR4_2 together with the sixth region F and the seventh region G. In addition, the second gate wiring 115 may constitute the fourth transistor TR4_1 together with the seventh region G and the fourth region D. The fourth transistors TR4_1 and TR4_2 may be connected in series serving as a dual gate transistor. For example, when the dual transistor is turned-off, a leakage current may be decreased. In this case, the fourth transistors TR4_1 and TR4_2 may be electrically connected via the seventh region G. In addition, the seventh transistor TR7 and the fourth transistor TR4_2 may be electrically connected to the sixth region F, and the tenth region J may be electrically connected to the ninth region I.

The fourth region D, the sixth region F, the seventh region G, and the tenth region J may be doped with an impurity. However, regions of the first and second active patterns 100_1 and 100_2 under the second gate wiring 115 may not be doped with an impurity. Thus, the fourth region D, the sixth region F, the seventh region G, and the tenth region J may operate as conductors, and the regions of the first and second active patterns 100_1 and 100_2 under the second gate wiring 115 may operate as channels of the fourth transistors TR4_1 and TR4_2 and the seventh transistor TR7. In example embodiments, the second gate wiring 115 may receive the data initialization signal GI of FIG. 2, and the sixth region F may receive the initialization voltage VINT of FIG. 2.

In example embodiments, each of the tenth region J of the seventh transistor TR7, the sixth region F of the fourth transistor TR4_2, and the seventh region G of the fourth transistor TR4_1 may be a source region, and each of the sixth region F of the seventh transistor TR7, the seventh region G of the fourth transistor TR4_2, and the fourth region D of the fourth transistor TR4_1 may be a drain region. Alternatively, the each of the tenth region J of the seventh transistor TR7, the sixth region F of the fourth transistor TR4_2, and the seventh region G of the fourth transistor TR4_1 may be a drain region, and each of the sixth region F of the seventh transistor TR7, the seventh region G of the fourth transistor TR4_2, and the fourth region D of the fourth transistor TR4_1 may be a source region.

The third gate wiring 120 may constitute the fifth transistor TR5 together with the first region A and the eighth region H and the sixth transistor TR6 together with the second region B and the ninth region I. The first region A, the second region B, the eighth region H, and the ninth region I may be doped with an impurity. However, regions of the first and second active patterns 100_1 and 100_2 under the third gate wiring 120 may not be doped with an impurity. Thus, the first region A, the second region B, the eighth region H, and the ninth region I may operate as conductors, and the regions of the first and second active patterns 100_1 and 100_2 under the third gate wiring 120 may operate as channels of the fifth transistor TR5 and the sixth transistor TR6. In example embodiments, the third gate wiring 120 may receive the light emission signal EM of FIG. 2.

In example embodiments, each of the eighth region H of the fifth transistor TR5 and the ninth region I of the sixth transistor TR6 may be a source region, and the each of the first region A of the fifth transistor TR5 and the second region B of the sixth transistor TR6 may be a drain region. Alternatively, each of the eighth region H of the fifth transistor TR5 and the ninth region I of the sixth transistor TR6 may be a drain region, and the each of the first region A of the fifth transistor TR5 and the second region B of the sixth transistor TR6 may be a source region.

Referring to FIGS. 8, 9, and 12, the OLED display device 500 may further include a first insulating interlayer 190, a third gate electrode 130, and an initialization voltage wiring 140.

The first insulating interlayer 190 may be disposed on the first gate electrode 105_1, the second gate electrode 105_2, the first gate wiring 110, the second gate wiring 115, and the third gate wiring 120. The first insulating interlayer 190 may cover the first gate electrode 105_1, the second gate electrode 105_2, the first gate wiring 110, the second gate wiring 115, and the third gate wiring 120 in the first and second sub-pixel circuit regions 10 and 30 on the gate insulation layer 160. In some embodiments, the first insulating interlayer 190 may be entirely disposed on the gate insulation layer 160. For example, the first insulating interlayer 190 may sufficiently cover the first gate electrode 105_1, the second gate electrode 105_2, the first gate wiring 110, the second gate wiring 115, and the third gate wiring 120 on the gate insulation layer 160, and may have a substantially flat upper surface planarizing a step around the first gate electrode 105_1, the second gate electrode 105_2, the first gate wiring 110, the second gate wiring 115, and the third gate wiring 120. Alternatively, the first insulating interlayer 190 may cover the first gate electrode 105_1, the second gate electrode 105_2, the first gate wiring 110, the second gate wiring 115, and the third gate wiring 120 on the gate insulation layer 160 with a substantially uniform thickness along a profile of the first gate electrode 105_1, the second gate electrode 105_2, the first gate wiring 110, the second gate wiring 115, and the third gate wiring 120. The first insulating interlayer 190 may include a silicon compound and/or a metal oxide.

The third gate electrode 130 and the initialization voltage wiring 140 may be disposed on the first insulating interlayer 190. In some embodiments, the third gate electrode 130 and the initialization voltage wiring 140 may be disposed on the same layer. Each of the third gate electrode 130 and the initialization voltage wiring 140 may include a metal, an alloy of a metal, a metal nitride, a conductive metal oxide, or a transparent conductive material. These may be used alone or in a suitable combination thereof. The third gate electrode 130 and the initialization voltage wiring 140 may be simultaneously formed using the same material. Alternatively, each the third gate electrode 130 and the initialization voltage wiring 140 may have a multi-layered structure including a plurality of layers.

The third gate electrode 130 may extend in the second direction D2 on the first insulating interlayer 190. The third gate electrode 130 may overlap the first gate electrode 105_1 in the first driving transistor region 60 of the first sub-pixel circuit region 10 and the second gate electrode 105_2 in the second driving transistor region 70 of the second sub-pixel circuit region 30. Accordingly, the third gate electrode 130 may constitute the storage capacitor CST of FIG. 2 together with the first gate electrode 105_1 in the first driving transistor region 60 and the second gate electrode 105_2 in the second driving transistor region 70. The third gate electrode 130 may receive the high power supply voltage ELVDD of FIG. 2. In addition, the third gate electrode 130 may have a first opening exposing a portion of the first gate electrode 105_1 in the first driving transistor region 60 and a second opening exposing a portion of the second gate electrode 105_2 in the second driving transistor region 70. The first gate electrode 105_1 may receive the initialization voltage VINT of FIG. 2 from a first connection pattern, which will be described below, via the first opening, and the second gate electrode 105_2 may receive the initialization voltage VINT of FIG. 2 from a second connection pattern, which will be also described below, via the second opening.

The initialization voltage wiring 140 may extend in the second direction D2 on the first insulating interlayer 190. The initialization voltage wiring 140 may overlap the sixth region F and provide the initialization voltage VINT to the sixth region F of the first sub-pixel circuit region 10 and the sixth region F of the second sub-pixel circuit region 30 through third and fourth connection patterns, which will be described below.

Referring to FIGS. 10, 11, and 12, the OLED display device 500 may further include a second insulating interlayer 195, a first high power supply voltage wiring 290_1, a second high power supply voltage wiring 290_2, a first data wiring 191_1, a second data wiring 191_2, a first connection pattern 230_1, a second connection pattern 230_2, a third connection pattern 388_1, a fourth connection pattern 388_2, a fifth connection pattern 390_1, and a sixth connection pattern 390_2, a planarization layer 270, a pixel defining layer 310, a first sub-pixel structure 200_1, a second sub-pixel structure 200_2, and an encapsulation substrate 450. The first sub-pixel structure 200_1 may include a first lower electrode 291_1, a first light emitting layer 330_1, and an upper electrode 340, and the second sub-pixel structure 200_2 may include a second lower electrode 291_2, a second light emitting layer 330_2, and the upper electrode 340. The upper electrode 340 included in the first sub-pixel structure 200_1 and the upper electrode 340 included in the second sub-pixel structure 200_2 may be integrally formed.

The second insulating interlayer 195 may be disposed on the third gate electrode 130 and the initialization voltage wiring 140. The second insulating interlayer 195 may cover the third gate electrode 130 and the initialization voltage wiring 140 in the first and second sub-pixel circuit regions 10 and 30 on the first insulating interlayer 190, and may be entirely disposed on the first insulating interlayer 190. For example, the second insulating interlayer 195 may sufficiently cover the third gate electrode 130 and the initialization voltage wiring 140 on the first insulating interlayer 190, and may have a substantially flat upper surface planarizing a step around the third gate electrode 130 and the initialization voltage wiring 140. Alternatively, the second insulating interlayer 195 may cover the third gate electrode 130 and the initialization voltage wiring 140 on the first insulating interlayer 190 having a substantially uniform thickness along a profile of the third gate electrode 130 and the initialization voltage wiring 140. The second insulating interlayer 195 may include a silicon compound and/or a metal oxide.

The first high power supply voltage wiring 290_1, the second high power supply voltage wiring 290_2, the first data wiring 191_1, the second data wiring 191_2, the first connection pattern 230_1, the second connection pattern 230_2, the third connection pattern 388_1, the fourth connection pattern 388_2, the fifth connection pattern 390_1, and the sixth connection pattern 390_2 may be disposed on the second insulating interlayer 195. In some embodiments, the first high power supply voltage wiring 290_1, the second high power supply voltage wiring 290_2, the first data wiring 191_1, the second data wiring 191_2, the first connection pattern 230_1, the second connection pattern 230_2, the third connection pattern 388_1, the fourth connection pattern 388_2, the fifth connection pattern 390_1, and the sixth connection pattern 390_2 may be disposed on the same layer. Each of the first high power supply voltage wiring 290_1, the second high power supply voltage wiring 290_2, the first data wiring 191_1, the second data wiring 191_2, the first connection pattern 230_1, the second connection pattern 230_2, the third connection pattern 388_1, the fourth connection pattern 388_2, the fifth connection pattern 390_1, and the sixth connection pattern 390_2 may include a metal, an alloy of a metal, a metal nitride, a conductive metal oxide, or a transparent conductive material. These may be used alone or in a suitable combination thereof. The first high power supply voltage wiring 290_1, the second high power supply voltage wiring 290_2, the first data wiring 191_1, the second data wiring 191_2, the first connection pattern 230_1, the second connection pattern 230_2, the third connection pattern 388_1, the fourth connection pattern 388_2, the fifth connection pattern 390_1, and the sixth connection pattern 390_2 may be simultaneously formed using the same material. Alternatively, each of the first high power supply voltage wiring 290_1, the second high power supply voltage wiring 290_2, the first data wiring 191_1, the second data wiring 191_2, the first connection pattern 230_1, the second connection pattern 230_2, the third connection pattern 388_1, the fourth connection pattern 388_2, the fifth connection pattern 390_1, and the sixth connection pattern 390_2 may have a multi-layered structure including a plurality of layers.

The first data wiring 191_1 may extend in the first direction D1 in the first driving transistor region 60 on the second insulating interlayer 195, and may be connected to the third region C of the first active pattern 100_1 via a contact hole 210_1. The first data wiring 191_1 may receive the data signal DATA of FIG. 2. Accordingly, the first data wiring 191_1 may provide the data signal DATA to the third region C of the first active pattern 100_1 via the contact hole 210_1. A voltage level of the data signal DATA may be changed according to a change of a gradation.

The second data wiring 191_2 may extend in the first direction D1 in the second driving transistor region 70 on the second insulating interlayer 195, and may be connected to the third region C of the second active pattern 100_2 via a contact hole 210_2. The second data wiring 191_2 may receive the data signal DATA of FIG. 2. Accordingly, the second data wiring 191_2 may provide the data signal DATA to the third region C of the second active pattern 100_2 via the contact hole 210_2. A voltage level of the data signal DATA may be changed according to a change of a gradation.

The first high power supply voltage wiring 290_1 may extend in the first direction D1 as being spaced apart from the first data wiring 191_1 in the first sub-pixel circuit region 10 on the second insulating interlayer 195. The first high power supply voltage wiring 290_1 may be connected to the eighth region H of the first active pattern 100_1 via a contact hole 355_1 and may be further connected to the third gate electrode 130 located in the first sub-pixel circuit region 10 via a contact hole 360_1. The first high power supply voltage wiring 290_1 may receive the high power supply voltage ELVDD of FIG. 2. Accordingly, the first high power supply voltage wiring 290_1 may provide the high power supply voltage ELVDD to the eighth region H of the first active pattern 100_1 and the third gate electrode 130 located in the first sub-pixel circuit region 10 via the contact holes 355_1 and 360_1, respectively.

The second high power supply voltage wiring 290_2 may extend in the first direction D1 as being spaced apart from the second data wiring 191_2 in the second sub-pixel circuit region 30 on the second insulating interlayer 195. The second high power supply voltage wiring 290_2 may be connected to the eighth region H of the second active pattern 100_2 via a contact hole 355_2 and may be further connected to the third gate electrode 130 located in the second sub-pixel circuit region 30 via a contact hole 360_2. The second high power supply voltage wiring 290_2 may receive the high power supply voltage ELVDD of FIG. 2. Accordingly, the second high power supply voltage wiring 290_2 may provide the high power supply voltage ELVDD to the eighth region H of the second active pattern 100_2 and the third gate electrode 130 located in the second sub-pixel circuit region 30 via the contact holes 355_2 and 360_2, respectively.

The first connection pattern 230_1 may extend in the first direction D1 in the first sub-pixel circuit region 10 on the second insulating interlayer 195 overlapping a portion of the fourth region D of the first active pattern 100_1 and a portion of the first driving transistor region 60. The first connection pattern 230_1 may be connected to the fourth region D of the first active pattern 100_1 via a contact hole 250_1 and may be further connected to the first gate electrode 105_1 via a contact hole 270_1. The fourth region D of the first active pattern 100_1 may receive the initialization voltage VINT, and the initialization voltage VINT may be applied to the first gate electrode 105_1 through the first connection pattern 230_1.

The second connection pattern 230_2 may extend in the first direction D1 in the second sub-pixel circuit region 30 on the second insulating interlayer 195 overlapping a portion of the fourth region D of the second active pattern 100_2 and a portion of the second driving transistor region 70. The second connection pattern 230_2 may be connected to the fourth region D of the second active pattern 100_2 via a contact hole 250_2 and may be further connected to the second gate electrode 105_2 via a contact hole 270_2. The fourth region D of the second active pattern 100_2 may receive the initialization voltage VINT, and the initialization voltage VINT may be applied to the second gate electrode 105_2 through the second connection pattern 230_2.

The third connection pattern 388_1 may overlap a portion of the initialization voltage wiring 140 and a portion of the sixth region F of the first active pattern 100_1 in the first sub-pixel circuit region 10 on the second insulating interlayer 195. The third connection pattern 388_1 may be connected to the initialization voltage wiring 140 via a contact hole 430_1 and may be further connected to the sixth region F of the first active pattern 100_1 via a contact hole 431_1. The initialization voltage VINT may be applied to the sixth region F of the first active pattern 100_1 through the third connection pattern 388_1.

The fourth connection pattern 388_2 may overlap a portion of the initialization voltage wiring 140 and a portion of the sixth region F of the second active pattern 100_2 in the second sub-pixel circuit region 30 on the second insulating interlayer 195. The fourth connection pattern 388_2 may be connected to the initialization voltage wiring 140 via a contact hole 430_2 and may be further connected to the sixth region F of the second active pattern 100_2 via a contact hole 431_2. The initialization voltage VINT may be applied to the sixth region F of the second active pattern 100_2 through the fourth connection pattern 388_2.

The fifth connection pattern 390_1 may overlap the ninth region I of the first active pattern 100_1 in the first sub-pixel circuit region 10 on the second insulating interlayer 195. The fifth connection pattern 390_1 may be connected to the ninth region I of the first active pattern 100_1 via a contact hole 410_1 and may be in contact with the first lower electrode 291_1 of the first sub-pixel structure 200_1. The fifth connection pattern 390_1 may provide a driving current to the first lower electrode 291_1 of the first sub-pixel structure 200_1.

The sixth connection pattern 390_2 may overlap the ninth region I of the second active pattern 100_2 in the second sub-pixel circuit region 30 on the second insulating interlayer 195. The sixth connection pattern 390_2 may be connected to the ninth region I of the second active pattern 100_2 via a contact hole 410_2 and may be in contact with the second lower electrode 291_2 of the second sub-pixel structure 200_2. The sixth connection pattern 390_2 may provide a driving current to the second lower electrode 291_2 of the second sub-pixel structure 200_2.

The planarization layer 270 may be disposed on the second insulating interlayer 195, the first high power supply voltage wiring 290_1, the second high power supply voltage wiring 290_2, the first data wiring 191_1, the second data wiring 191_2, the first connection pattern 230_1, the second connection pattern 230_2, the third connection pattern 388_1, the fourth connection pattern 388_2, the fifth connection pattern 390_1, and the sixth connection pattern 390_2. The planarization layer 270 may have a first contact hole exposing a portion of the fifth connection pattern 390_1 that is connected to the sixth transistor TR6 disposed in the first sub-pixel circuit region 10 and a second contact hole exposing a portion of the sixth connection pattern 390_2 that is connected to the sixth transistor TR6 disposed in the second sub-pixel circuit region 30. The planarization layer 270 may have a large thickness to sufficiently cover the first high power supply voltage wiring 290_1, the second high power supply voltage wiring 290_2, the first data wiring 191_1, the second data wiring 191_2, the first connection pattern 230_1, the second connection pattern 230_2, the third connection pattern 388_1, the fourth connection pattern 388_2, the fifth connection pattern 390_1, and the sixth connection pattern 390_2 on the second insulating interlayer 195. In this case, the planarization layer 270 may have a substantially flat upper surface, and a planarization process may be further performed on the planarization layer 270 to implement the flat upper surface of the planarization layer 270. The planarization layer 270 may include an organic material or an inorganic material. In example embodiments, the planarization layer 270 may include one or more organic materials. For example, the planarization layer 270 may include one or more of a photoresist, a polyacryl-based resin, a polyimide-based resin, a polyamide-based resin, a siloxane-based resin, an acryl-based resin, and an epoxy-based resin.

The first lower electrode 291_1 of the first sub-pixel structure 200_1 may be disposed in the first sub-pixel circuit region 10 on the planarization layer 270. The first lower electrode 291_1 may be in direct contact with the fifth connection pattern 390_1 via the first contact hole of the planarization layer 270 and may be electrically connected to the sixth transistor TR6 disposed in the first sub-pixel circuit region 10 through the fifth connection pattern 390_1. Accordingly, the first lower electrode 291_1 of the first sub-pixel structure 200_1 may receive the driving current ID of FIG. 2 through the fifth connection pattern 390_1. In example embodiments, the first lower electrode 291_1 may be an anode electrode. Alternatively, the first lower electrode 291_1 may be a cathode electrode.

The second lower electrode 291_2 of the second sub-pixel structure 200_2 may be disposed in the second sub-pixel circuit region 30 on the planarization layer 270. The second lower electrode 291_2 may be in direct contact with the sixth connection pattern 390_2 via the second contact hole of the planarization layer 270 and may be electrically connected to the sixth transistor TR6 disposed in the second sub-pixel circuit region 30 through the sixth connection pattern 390_2. Accordingly, the second lower electrode 291_2 of the second sub-pixel structure 200_2 may receive the driving current ID of FIG. 2 through the sixth connection pattern 390_2. In example embodiments, the second lower electrode 291_2 may be an anode electrode. Alternatively, the second lower electrode 291_2 may be a cathode electrode.

Each of the first lower electrode 291_1 and the second lower electrode 291_2 may include a metal, a metal alloy, a metal nitride, a conductive metal oxide, or a transparent conductive material. These may be used alone or in a suitable combination thereof. The first lower electrode 291_1 and the second lower electrode 291_2 may be simultaneously formed using the same material. Alternatively, each of the first lower electrode 291_1 and the second lower electrode 291_2 may have a multi-layered structure including a plurality of layers.

The pixel defining layer 310 may be disposed on a portion of the first lower electrode 291_1, a portion of the second lower electrode 291_2, and the planarization layer 270. The pixel defining layer 310 may cover both lateral portions of the first lower electrode 291_1 and both lateral portions of the second lower electrode 291_2 and may have openings exposing an upper surface of each of the first and second lower electrodes 291_1 and 291_2. The pixel defining layer 310 may include an organic material or an inorganic material. In example embodiments, the pixel defining layer 310 may include one or more organic materials.

The first light emitting layer 330_1 of the first sub-pixel structure 200_1 may be disposed on the first lower electrode 291_1 exposed by the opening of the pixel defining layer 310 in the first sub-pixel circuit region 10, and the second light emitting layer 330_2 of the second sub-pixel structure 200_2 may be disposed on the second lower electrode 291_2 exposed by the opening of the pixel defining layer 310 in the second sub-pixel circuit region 30. Each of the first and second light emitting layers 330_1 and 330_2 may be formed using at least one of light emitting materials capable of generating different colors of light (e.g., a red color of light, a blue color of light, and a green color of light) according to a color of the sub-pixels. Alternatively, each of the first and second light emitting layers 330_1 and 330_2 may generally generate a white color of light by stacking a plurality of light emitting materials capable of generating different colors of light such as a red color of light, a green color of light, and a blue color of light. In this case, a color filter (not shown) may be disposed on each of the first and second light emitting layers 330_1 and 330_2. For example, the color filter may overlap each of the first and second light emitting layers 330_1 and 330_2 on an upper surface of the encapsulation substrate 450. The color filter may include at least one selected from a red color filter, a green color filter, and a blue color filter. Alternatively, the color filter may include a yellow color filter, a cyan color filter, and a magenta color filter. The color filter may include a photosensitive resin, and/or a color photoresist. In example embodiments, the first light emitting layer 330_1 may emit a red or green color of light, and the second light emitting layer 330_2 may emit a blue color of light.

The upper electrode 340 may be disposed on the pixel defining layer 310, the first light emitting layer 330_1, and the second light emitting layer 330_2. The upper electrode 340 may cover the pixel defining layer 310, the first light emitting layer 330_1, and the second light emitting layer 330_2. In some embodiments, the upper electrode 340 may be disposed on the entire substrate 50. In example embodiments, the upper electrode 340 may be a cathode electrode and may receive the low power supply voltage ELVSS of FIG. 2. Alternatively, the upper electrode 340 may be an anode electrode. The upper electrode 340 may include a metal, an alloy of a metal, a metal nitride, a conductive metal oxide, or a transparent conductive material. These may be used alone or in a suitable combination thereof. The upper electrode 340 may be integrally formed in the first sub-pixel circuit region 10 and the second sub-pixel circuit region 30. In some example embodiments, the upper electrode 340 may have a multi-layered structure including a plurality of layers.

The encapsulation substrate 450 may be disposed on the upper electrode 340. The encapsulation substrate 450 and the substrate 50 may include substantially the same material. For example, the encapsulation substrate 450 may include a quartz substrate, a synthetic quartz substrate, a calcium fluoride substrate, a fluoride-doped quartz substrate, a soda-lime glass substrate, or a non-alkali glass substrate. In some example embodiments, the encapsulation substrate 450 may include a transparent inorganic material or a flexible plastic material. For example, the encapsulation substrate 450 may include a flexible transparent resin substrate. In this case, to increase flexibility of the display device 500, the encapsulation substrate 450 may include a stacked structure in which at least one inorganic layer and at least one organic layer are alternately stacked. The stacked structure may include a first inorganic layer, an organic layer, and a second inorganic layer. For example, the first inorganic layer having flexibility may be disposed along a profile of the upper electrode 340, and the organic layer having flexibility may be disposed on the first inorganic layer. The second inorganic layer having flexibility may be disposed on the organic layer. That is, the stacked structure may correspond to a thin film encapsulation structure that is in direct contact with the upper electrode 340.

As the second active pattern 100_2 of the OLED display device 500 according to example embodiments has a relatively small second area A2 or a relatively short second distance L2 in the second driving transistor region 70, the MTP defect of the OLED display device 500 may be improved, thereby improving visibility of the OLED display device 500.

Figure 13:
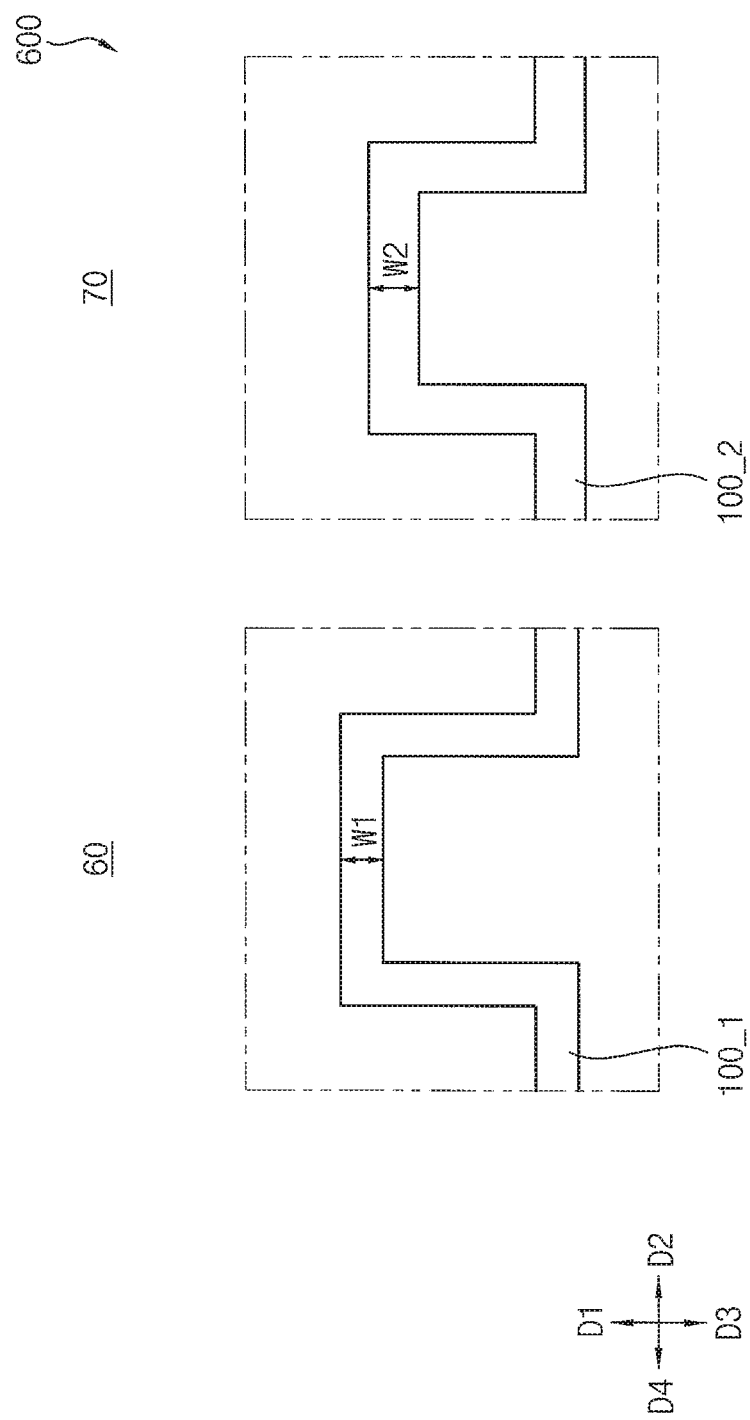
FIG. 13 is a layout diagram illustrating an example of an active pattern included in an OLED display device in accordance with example embodiments.

FIG. 13 is a layout diagram illustrating an example of an active pattern included in an OLED display device in accordance with example embodiments. For example, FIG. 13 corresponds to a layout diagram for describing active patterns disposed in the first and second driving transistor regions 60 and 70 of FIG. 3. An OLED display device 600 illustrated in FIG. 13 may have a configuration substantially the same as or similar to that of the OLED display device 500 described with reference to FIGS. 1 through 12 except for the first active pattern 100_1. In FIG. 13, detailed descriptions for elements that are substantially the same as or similar to elements described with reference to FIGS. 1 through 12 may not be repeated.

Referring to FIGS. 3, 4, 5, and 13, in the first driving transistor region 60 of the first sub-pixel circuit region 10, the first bent portion 150_1 may include the first extension 151_1, the second extension 152_1, and the third extension 153_1. The first extension 151_1 may extend in the first direction D1 that is perpendicular to an upper surface of the substrate 50, and the second extension 152_1 may extend from a first distal end of the first extension 151_1 in the second direction D2 that is perpendicular to the first direction D1. The third extension 153_1 may extend from a first distal end of the second extension 152_1 in the third direction D3 that is perpendicular to the second direction D2 and is opposite to the first direction D1. The first extension 151_1, the second extension 152_1, and the third extension 153_1 may be integrally formed. A space (e.g., the first area A1 of FIG. 5) formed by the first extension 151_1, the second extension 152_1, and the third extension 153_1 may be defined as the first recess 155_1. For example, the first active pattern 100_1 may have a shape that is bent in the first direction D1 in the first driving transistor region 60.

The first active pattern 100_1 may have the first distance L1 in the first driving transistor region 60, and the first transistor TR1 disposed in the first driving transistor region 60 may have a relatively large driving range because the first distance L1 is relatively longer than the second distance L2.

In example embodiments, the first active pattern 100_1 may have a first width W1 in the first driving transistor region 60 that is smaller than a width of the first active pattern 100_1 of FIGS. 4 and 5. For example, the first width W1 may be reduced from about 3.5 micrometers to about 3 micrometers. Alternatively, the first width W1 of FIG. 13 may be in a range between about 2 and about 3 micrometers. In addition to reduction of the first width W1, the first distance L1 of the first active pattern 100_1 of FIG. 13 may be increased compared to the first distance L1 of the first active pattern 100_1 of FIGS. 4 and 5. Accordingly, a driving range of the first transistor TR1 disposed in the first driving transistor region 60 of the first active pattern 100_1 of FIG. 13 may be increased compared to the driving range of each of the first transistor TR1 of FIGS. 4 and 5 and the first transistor TR1 disposed in the second driving transistor region 70 of FIG. 13.

In the second driving transistor region 70 of the second sub-pixel circuit region 30, the second bent portion 150_2 may include the fourth extension 151_2, the fifth extension 152_2, and the sixth extension 153_2. The fourth extension 151_2 may extend in the first direction D1, and the fifth extension 152_2 may extend from a first distal end of the fourth extension 151_2 in the second direction D2. The sixth extension 153_2 may extend from a first distal end of the fifth extension 152_2 in the third direction D3. The fourth extension 151_2, the fifth extension 152_2, and the sixth extension 153_2 may be integrally formed. A space (e.g., the second area A2 of FIG. 5) formed by the fourth extension 151_2, the fifth extension 152_2, and the sixth extension 153_2 may be defined as the second recess 155_2. For example, the second active pattern 100_2 may have a shape that is bent in the first direction D1 in the second driving transistor region 70.

The second active pattern 100_2 may have the second distance L2 in the second driving transistor region 70, and the first transistor TR1 disposed in the second driving transistor region 70 may have a relatively small driving range compared to the first transistor TR1 disposed in the first driving transistor region 60 because the second distance L2 is shorter than the first distance L1.

In example embodiments, the second active pattern 100_2 may have a second width W2 that is greater than the first width W1 in the second driving transistor region 70. For example, the second width W2 of the second active pattern 100_2 of FIG. 13 may be identical to a width of the second active pattern 100_2 of FIGS. 4 and 5. For example, the second width W2 may be about 3.5 micrometers.

When a driving range is increased to improve a mura effect (or a stain effect) that may be generated while the OLED display device 600 displays an image, the MTP defect may occur. When the OLED display device 600 displays the image at a low gradation, the MTP defect may occur due to an insufficient data output voltage of a blue sub-pixel because a data voltage margin of the blue sub-pixel is relatively small. When a width of the first active pattern 100_1 disposed in the first driving transistor region 60 is relatively decreased, the mura defect can be reduced.

Accordingly, to simultaneously solve the issues of the mura defect and the MTP defect, the OLED display device 600 according to the example embodiments includes the first active pattern 100_1 having a relatively small first width W1 and a relatively long first distance L1 in the first driving transistor region 60, and the first transistor TR1 disposed in the first driving transistor region 60 may have a relatively large driving range. In addition, as the OLED display device 600 includes the second active pattern 100_2 having a relatively large second width W2 and a relatively short second distance L2 in the second driving transistor region 70, the first transistor TR1 disposed in the second driving transistor region 70 may have a relatively small driving range. In this case, the mura defect and the MTP defect may be simultaneously improved.

In some example embodiments, the OLED display device 600 may be manufactured by suitably choosing and changing the first width W1 and/or the first distance L1 of the first active pattern 100_1 and the second width W2 and/or the second distance L2 of the second active pattern 100_2 to improve the mura defect and the MTP defect.

Figure 14:
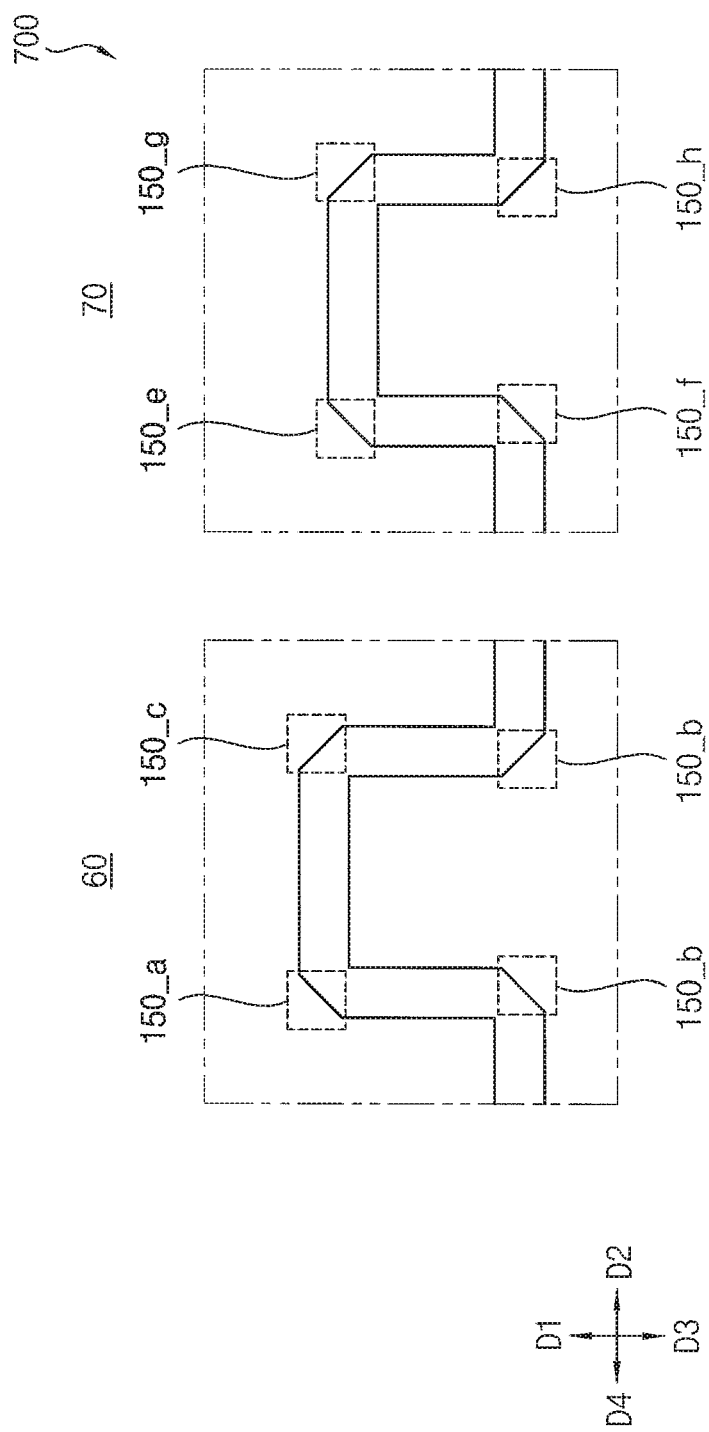
FIG. 14 is a layout diagram illustrating another example of an active pattern included in an OLED display device in accordance with example embodiments.

FIG. 14 is a layout diagram illustrating another example of an active pattern included in an OLED display device in accordance with example embodiments. For example, FIG. 14 corresponds to a layout diagram for describing active patterns disposed in the first and second driving transistor regions 60 and 70 of FIG. 3. An OLED display device 700 illustrated in FIG. 14 may have a configuration substantially the same as or similar to that of the OLED display device 500 described with reference to FIGS. 1 through 12 except for the first active pattern 100_1 and the second active pattern 100_2. In FIG. 14, detailed descriptions for elements that are substantially the same as or similar to elements described with reference to FIGS. 1 through 12 may not be repeated.

Referring to FIGS. 3, 4, 5, and 14, in the first driving transistor region 60 of the first sub-pixel circuit region 10, a taper angle of each of edges 150_a, 150_b, 150_c, and 150_d (or corners) of the first bent portion 150_1 may be relatively increased. For example, the first bent portion 150_1 of FIG. 14 may be formed by removing a portion of the edges of the first bent portion 150_1 of FIG. 4. That is, the first active pattern 100_1 according to the OLED display device 700 may include the first bent portion 150_1 that includes the edges 150_a, 150_b, 150_c, and 150_d having a gradual taper angle.

In similar, in the second driving transistor region 70 of the second sub-pixel circuit region 30, a taper angle of each of edges 150_e, 150_f, 150_g, and 150_h of the second bent portion 150_2 may be relatively increased. For example, the second bent portion 150_2 of FIG. 14 may be formed by removing a portion of the edges of the second bent portion 150_2 of FIG. 4. That is, the second active pattern 100_2 according to the OLED display device 700 may include the second bent portion 150_2 that includes the edges 150_e, 150_f, 150_g, and 150_h having a gradual taper angle.

FIG. 15 is a layout diagram illustrating still another example of an active pattern included in an OLED display device in accordance with example embodiments. For example, FIG. 15 corresponds to a layout diagram for describing active patterns disposed in the first and second driving transistor regions 60 and 70 of FIG. 3. An OLED display device illustrated in FIG. 15 may have a configuration substantially the same as or similar to that of the OLED display device 500 described with reference to FIGS. 1 through 12 except for the first active pattern 100_1 and the second active pattern 100_2. In FIG. 15, detailed descriptions for elements that are substantially the same as or similar to elements described with reference to FIGS. 1 through 12 may not be repeated.

Referring to FIGS. 3, 4, 5, and 15, in the first driving transistor region 60 of the first sub-pixel circuit region 10, a plurality of first bent portions 150_1 may be located, and the first bent portions 150_1 may be integrally formed. A plurality of first recesses 155_1 may be defined by the first bent portions 150_1. For example, a shape of the first bent portions 150_1 may have at least one selected from a plan shape of an S, a plan shape of a W, etc.

In the second driving transistor region 70 of the second sub-pixel circuit region 30, a plurality of second bent portions 150_2 may be located, and the second bent portions 150_2 may be integrally formed. A plurality of second recesses 155_2 may be defined by the second bent portions 150_2. For example, a shape of the second bent portions 150_2 may have at least one selected from a plan shape of an S, a plan shape of a W, etc.

In example embodiments, an area of each of the second recesses 155_2 may be less than an area of each of the first recesses 155_1.

The first active pattern 100_1 may have the first distance L1 (e.g., a total length of the first bent portions 150_1) in the first driving transistor region 60, and the first transistor TR1 disposed in the first driving transistor region 60 may have a relatively large driving range because the first distance L1 is relatively longer than the second distance L2.

The second active pattern 100_2 may have the second distance L2 (e.g., a total length of the second bent portions 150_2) in the second driving transistor region 70, and the first transistor TR1 disposed in the second driving transistor region 70 may have a relatively small driving range because the second distance L2 is relatively shorter than the first distance L1.

The present disclosure may be applied to various display devices including an OLED display device. For example, the present disclosure may be applied to, but is not limited to, a vehicle-display device, a ship-display device, an aircraft-display device, a portable communication device, a display device for information transfer, and a medical-display device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present disclosure. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present disclosure including the appended claims.

What is claimed is:

1. An organic light emitting diode ("OLED") display device, comprising:
    a substrate having a plurality of pixel circuit regions, each of the plurality of pixel circuit regions has a first sub-pixel circuit region corresponding to a first color and including a first driving transistor region, and a second sub-pixel circuit region corresponding to a second color that is different from the first color and including a second driving transistor region, wherein the first sub-pixel circuit region is located adjacent to the second sub-pixel circuit region;
    a first active pattern disposed in the first sub-pixel circuit region on the substrate and corresponding to the first color, the first active pattern having a first bent portion in the first driving transistor region, the first active pattern having a first recess formed by the first bent portion in a direction of a plan surface;
    a second active pattern disposed in the second sub-pixel circuit region on the substrate and corresponding to the second color, the second active pattern having a second bent portion in the second driving transistor region, the second active pattern having a second recess formed by the second bent portion in the direction in the plan surface;
    a first sub-pixel structure connected to and disposed on the first active pattern in the first sub-pixel circuit region, and emitting a first light of the first color; and
    a second sub-pixel structure connected to and disposed on the second active pattern in the second sub-pixel circuit region, and emitting a second light of the second color,
    wherein the first sub-pixel circuit region and the second sub-pixel circuit region have a substantially same size, and
    wherein a first area of the first recess of the first active pattern corresponding to the first color is different from a second area of the second recess of the second active pattern that corresponds to the second color based on the first color of the light emitted in the first sub-pixel structure and the second color of the light emitted in the second sub-pixel structure.

2. The OLED display device of claim 1, wherein the first bent portion includes:
    a first extension extending in a first direction that is perpendicular to an upper surface of the substrate;

a second extension extending from a first distal end of the first extension in a second direction that is perpendicular to the first direction; and a third extension extending from a first distal end of the second extension in a third direction that is perpendicular to the second direction and is opposite to the first direction, and wherein the first, second, and third extensions are integrally formed.

3. The OLED display device of claim 2, wherein a space formed by the first, second, and third extensions is defined as the first recess.

4. The OLED display device of claim 2, wherein the first active pattern has a shape that is bent in the first direction in the first driving transistor region.

5. The OLED display device of claim 2, wherein the second bent portion includes:

a fourth extension extending in the first direction;

a fifth extension extending from a first distal end of the fourth extension in the second direction; and a sixth extension extending from a first distal end of the fifth extension in the third direction, and wherein the fourth, fifth, and sixth extensions are integrally formed.

6. The OLED display device of claim 5, wherein a space formed by the fourth, fifth, and sixth extensions is defined as the second recess.

7. The OLED display device of claim 5, wherein the second active pattern has a shape that is bent in the first direction in the second driving transistor region.

8. The OLED display device of claim 5, wherein the first bent portion has a first width, and the second bent portion has a second width that is less than the first width.

9. The OLED display device of claim 5, wherein the first sub-pixel circuit region further includes a first switching transistor region surrounding the first driving transistor region, and wherein the second sub-pixel circuit region further includes a second switching transistor region surrounding the second driving transistor region.

10. The OLED display device of claim 9, wherein the first active pattern further includes:

a seventh extension disposed in the first switching transistor region, the seventh extension being spaced apart from the first bent portion in a fourth direction that is opposite to the second direction, the seventh extension extending in the first direction; and a first protrusion protruded from the seventh extension in the second direction, the first protrusion being coupled to a second distal end that is opposite to the first distal end of the first extension, and wherein the seventh extension, the first protrusion, and the first bent portion are integrally formed.

11. The OLED display device of claim 10, wherein the second active pattern further includes:

an eighth extension disposed in the second switching transistor region, the eighth extension being spaced apart from the second bent portion in the fourth direction, the eighth extension extending in the first direction; and a second protrusion protruded from the eighth extension in the second direction, the second protrusion being coupled to a second distal end that is opposite to the first distal end of the fourth extension, and wherein the eighth extension, the second protrusion, and the second bent portion are integrally formed.

12. The OLED display device of claim 11, further comprising:

a first gate wiring extending in the second direction on the seventh extension of the first active pattern and the eighth extension of the second active pattern.

13. The OLED display device of claim 12, wherein a first switching transistor is disposed in a portion where the first gate wiring crosses the seventh extension, and a second switching transistor is disposed in a portion where the first gate wiring crosses the eighth extension.

14. The OLED display device of claim 1, further comprising:

a first gate electrode disposed on the first bent portion, wherein the first gate electrode and the first bent portion form a first driving transistor; and a second gate electrode disposed on the second bent portion, wherein the second gate electrode and the second bent portion form a second driving transistor.

15. The OLED display device of claim 14, wherein the first and second gate electrodes have a same shape.

16. The OLED display device of claim 15, wherein a first area where the first gate electrode overlaps the first bent portion is greater than a second area where the second gate electrode overlaps the second bent portion.

17. The OLED display device of claim 15, wherein a distance of the first active pattern that overlaps the first gate electrode is greater than a distance of the second active pattern that overlaps the second gate electrode.

18. The OLED display device of claim 14, wherein the first sub-pixel structure includes a first lower electrode and a first light emitting layer disposed on the first lower electrode, and the second sub-pixel structure includes a second lower electrode and a second light emitting layer disposed on the second lower electrode.

19. The OLED display device of claim 18, wherein the first light emitting layer emits a red color of light or a green color of light, and the second light emitting layer emits a blue color of light.

20. The OLED display device of claim 14, wherein the first driving transistor and the first active pattern form a first sub-pixel circuit, and the second driving transistor and the second active pattern form a second sub-pixel circuit.

21. An organic light emitting diode ("OLED") display device, comprising:

a plurality of pixels arranged on a substrate, wherein each of the plurality of pixels comprises:

a first sub-pixel emitting a first light of a first color and comprising a first active pattern, the first active pattern including a first bent portion;

a second sub-pixel emitting a second light of a second color that is different from the first color and comprising a second active pattern, the second active pattern being disposed adjacent to the first active pattern and including a second bent portion;

a first driving transistor including a first gate electrode disposed on the first bent portion of the first active pattern;

a second driving transistor including a second gate electrode disposed on the second bent portion of the second active pattern;

a first sub-pixel structure electrically connected to the first driving transistor, the first sub-pixel structure emitting the first light of the first color; and a second sub-pixel structure electrically connected to the second driving transistor, the second sub-pixel structure emitting the second light of the second color, wherein a first sub-pixel circuit region of the first sub-pixel and a second sub-pixel circuit region of the second sub-pixel have a substantially same size, and wherein a first distance of the first active pattern that corresponds to the first color and overlaps the first gate electrode is different from a second distance of the second active pattern that corresponds to the second color and overlaps the second gate electrode.

22. The OLED display device of claim 21, wherein the first bent portion has at least one recess formed by the first bent portion in a direction of a plan surface, and the second bent portion has at least one recess formed by the second bent portion in a direction of a plan surface.

* * * * *